(12) United States Patent
Kimura et al.

(10) Patent No.: US 6,420,198 B1
(45) Date of Patent: Jul. 16, 2002

(54) GALLIUM NITRIDE BASED COMPOUND SEMICONDUCTOR LASER AND METHOD OF FORMING THE SAME

(75) Inventors: Akitaka Kimura; Masaaki Nido, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/718,432

(22) Filed: Nov. 24, 2000

Related U.S. Application Data

(62) Division of application No. 08/998,430, filed on Dec. 24, 1997, now Pat. No. 6,201,823.

(30) Foreign Application Priority Data

Dec. 24, 1996 (JP) .............................................. 8-343125

(51) Int. Cl.[7] .............................................. H01L 21/00
(52) U.S. Cl. .......................... 438/22; 438/46; 438/483
(58) Field of Search .............................. 438/22, 24, 39, 438/40, 41–47, 483

(56) References Cited

U.S. PATENT DOCUMENTS

| | | | | |
|---|---|---|---|---|
| 5,076,860 A | * | 12/1991 | Ohba et al. | 148/110 |
| 5,202,285 A | * | 4/1993 | Sungano et al. | 437/129 |
| 5,656,539 A | * | 8/1997 | Motoda et al. | 438/39 |
| 5,987,048 A | | 11/1999 | Ishikawa et al. | |
| 6,031,858 A | * | 2/2000 | Hatakoshi et al. | 372/46 |
| 6,187,606 B1 | * | 3/2001 | Edmond et al. | 438/46 |
| 6,110,756 A1 | * | 8/2001 | Otsuka et al. | 438/41 |

FOREIGN PATENT DOCUMENTS

| | | |
|---|---|---|
| JP | 1270287 | 10/1989 |
| JP | 2186690 | 7/1990 |
| JP | 818159 | 1/1996 |
| JP | 897508 | 4/1996 |
| JP | 8264891 | 10/1996 |
| JP | 8340151 | 12/1996 |
| JP | 918086 | 1/1997 |
| JP | 9116232 | 5/1997 |
| JP | 9129974 | 5/1997 |
| JP | 9270569 | 10/1997 |
| JP | 9283854 | 10/1997 |
| JP | 9312442 | 12/1997 |

* cited by examiner

*Primary Examiner*—Savitri Mulpuri
(74) *Attorney, Agent, or Firm*—Young & Thompson

(57) ABSTRACT

A semiconductor device and method of forming a current block layer structure includes the steps of providing dielectric stripe masks defining at least a stripe-shaped opening on a surface of a compound semiconductor region having a hexagonal crystal structure, and selectively growing at least a current block layer of a compound semiconductor having the hexagonal crystal structure on the surface of the compound semiconductor region by use of the dielectric stripe masks.

39 Claims, 7 Drawing Sheets

GALLIUM NITRIDE BASED COMPOUND SEMICONDUCTOR LASER AND METHOD OF FORMING THE SAME

This application is a divisional of application Ser. No. 08/998,430, filed on Dec. 24, 1997, U.S. Pat. No. 6,201,823 the entire contents of which are hereby incorporated by reference.

BACKGROUND OF THE INVENTION

The present invention relates to a semiconductor laser diode and a method of forming the same, and more particularly to a gallium nitride based compound semiconductor laser having a current block layer structure selectively grown for a current confinement and a method of forming the same.

Gallium nitride is larger in energy ban gap than those of indium phosphate and gallium arsenide, for which reason gallium nitride based semiconductors of $In_xAl_yGa_{l-x-y}N$ ($0 \leq x \leq 1$, $0 \leq y \leq 1$, $0 \leq x+y \leq 1$) may be applied to light emitting diodes such as semiconductor laser diodes for emitting a light of an wavelength in the range of green light wavelength to ultraviolet ray wavelength.

Gallium nitride based semiconductor may have either hexagonal crystal structure or cubic crystal structure. The hexagonal crystal structure is more stable in energy than the cubic crystal structure.

One of conventional gallium nitride based semiconductor laser diodes is disclosed by S. Nakamura et al. in Extended Abstracts of 1996 International Conference On Solid State Devices And Materials, Yokohama, 1996, pp. 67–69.

The conventional gallium nitride based semiconductor laser diode will be described with reference to FIG. 1. A 300 Å-thick undoped GaN buffer layer 102 is formed on a (11–20)-face sapphire substrate 201. A 3 μm-thick n-type GaN contact layer 103 doped with Si is formed on the 300 Å-thick undoped GaN buffer layer 102. A 0.1 μm-thick n-type $In_{0.05}Ga_{0.95}N$ layer 104 doped with Si is formed on the 3 μm-thick n-type GaN contact layer 103. A 0.4 μm-thick n-type $Al_{0.07}Ga_{0.93}N$ cladding layer 105 doped with Si is formed on the 0.1 μm-thick n-type $In_{0.05}Ga_{0.95}N$ layer 104. A 0.1 μm-thick n-type GaN optical guide layer 106 doped with Si is formed on the 0.4 μm-thick n-type $Al_{0.07}Ga_{0.93}N$ cladding layer 105. A multiple quantum well active layer 107 is formed on the 0.1 μm-thick n-type GaB optical guide layer 106. The multiple quantum well active layer 107 comprises 7 periods of 25 Å-thick undoped $In_{0.2}Ga_{0.8}N$ quantum well layers and 50 Å-thick undoped $In_{0.05}Ga_{0.95}N$ barrier layers. A 200 Å-thick p-type $Al_{0.2}Ga_{0.8}N$ layer 108 doped with Mg is formed on the multiple quantum well active layer 107. A 0.1 μm-thick p-type GaN optical guide layer 109 doped with Mg is formed on the 200 Å-thick p-type $Al_{0.2}Ga_{0.8}N$ layer 108. A 0.4 μm-thick p-type $Al_{0.07}Ga_{0.93}N$ cladding layer 110 doped with Mg is formed on the 0.1 μm-thick p-type GaN optical guide layer 109. A 0.2 μm-thick p-type GaN contact layer 111 doped with Mg is formed on the 0.4 μm-thick p-type $Al_{0.07}Ga_{0.93}N$ cladding layer 110. A p-electrode 112 is formed on the 0.2 μm-thick p-type GaN contact layer 111. The p-electrode 112 comprises a nickel layer laminated on the top flat surface of the 0.2 μm-thick p-type GaN contact layer 111 and a gold layer laminated on the nickel layer. An n-electrode 113 is provided on the recessed surface of the 3 μm-thick n-type GaN contact layer 103. The n-electrode 113 comprises a titanium layer laminated on the 3 μm-thick n-type GaN contact layer 103 and an aluminum layer laminated on the titanium layer.

All of the semiconductor layers have hexagonal crystal structure with the (0001)-face grown over the (11–20)-face sapphire substrate 201.

The above conventional gallium nitride based semiconductor laser diode has no current confinement structure, for which reason the above conventional gallium nitride based semiconductor laser diode has a relatively large threshold current.

Other conventional gallium nitride based semiconductor laser diode is disclosed by S. Nakamura et al. in Applied Physics Letters, vol. 69 (1996), p 1477. The other conventional gallium nitride based semiconductor laser diode will be described with reference to FIG. 2. A 300 Å-thick undoped GaN buffer layer 102 is formed on a (11–20)-face sapphire substrate 201. A 3 μm-thick n-type GaN contact layer 103 doped with Si is formed on the 300 Å-thick undoped GaN buffer layer 102. A 0.1 μm-thick n-type $In_{0.05}Ga_{0.95}N$ layer 104 doped with Si is formed on the 3 μm-thick n-type GaN contact layer 103. A 0.5 μm-thick n-type $Al_{0.05}Ga_{0.95}N$ cladding layer 605 doped with Si is formed on the 0.1 μm-thick n-thick $In_{0.05}Ga_{0.95}N$ layer 104. A 0.1 μm-thick n-type GaN optical guide layer 106 doped with Si is formed on the 0.5 μm-thick n-type $Al_{0.05}Ga_{0.95}N$ cladding layer 605. A multiple quantum well active layer 707 is formed on the 0.1 μm-thick n-type GaN optical guide layer 106. The multiple quantum well active layer 707 comprises 7 periods of 30 Å-thick undoped $In_{0.2}Ga_{0.8}N$ quantum well layers and 60 Å-thick undoped $In_{0.05}Ga_{0.95}N$ barrier layers. A 200 Å-thick p-type $Al_{0.2}Ga_{0.8}N$ layer 108 doped with Mg is formed on the multiple quantum well active layer 707. A 0.1 μm-thick p-type GaN optical guide layer 109 doped with Mg is formed on the 200 Å-thick p-type $Al_{0.2}Ga_{0.8}N$ layer 108. A 0.5 μm-thick p-type $Al_{0.05}Ga0.95N$ cladding layer 710 doped with Mg is formed on the 0.1 μm-thick p-type GaN optical guide layer 109. A 0.2 μm-thick p-type GaN contact layer 111 doped with Mg is formed on the 0.4 μm-thick p-type $Al_{0.05}Ga_{0.95}N$ cladding layer 710. The 0.2 μm-thick p-type GaN contact layer 111 has a ridge-shape. A p-electrode 112 is formed on the top portion of the 0.2 μm-thick p-type GaN contact layer 111. The p-electrode 112 comprises a nickel layer laminated on the top flat surface of the 0.2 μm-thick p-type GaN contact layer 111 and a gold layer laminated on the nickel layer. A silicon oxide film is formed which extends on the sloped side walls of the ridge portion of the 0.2 μm-thick p-type GaN contact layer 111 and also on the flat base portions of the 0.2 μm-thick p-type GaN contact layer 111 as well as on side walls of the above laminations of the 3 μm-thick n-type GaN contact layer 103, the 0.1 μm-thick n-type $In_{0.05}Ga_{0.95}N$ layer 104, the 0.5 μm-thick n-type $Al_{0.05}Ga_{0.95}N$ cladding layer 605, the 0.1 μm-thick n-type GaN optical guide layer 106, the multiple quantum well active layer 707, the 200 Å-thick p-type $Al_{0.2}Ga_{0.8}N$ layer 108, the 0.1 μm-thick p-type GaN optical guide layer 109, the 0.4 μm-thick p-type $Al_{0.05}Ga_{0.95}N$ cladding layer 710 and the 0.2 μm-thick p-type GaN contact layer 111. An n-electrode 113 is provided on the recessed surface of the 3 μm-thick n-type GaN contact layer 103. The n-electrode 113 comprises a titanium layer laminated on the 3 μm-thick n-type GaN contact layer 103 and an aluminum layer laminated on the titanium layer.

All of the semiconductor layers have hexagonal crystal structure with the (0001)-face grown over the (11–20)-face sapphire substrate 201.

The above ridge structure of the 0.2 μm-thick p-type GaN contact layer 111 might contribute any current confinement for reduction in threshold current. Since, however, a contact area between the p-electrode and the 0.2 μm-thick p-type GaN contact layer 111 is small, a contact resistance of the p-electrode to the 0.2 μm-thick p-type GaN contact layer 111 is relatively large.

Whereas the above ridge structure of the 0.2 μm-thick p-type GaN contact layer 111 is defined by a dry etching process, this dry etching process may provide a damage to the semiconductor layers.

The use of this dry etching process results in complicated fabrication processes for the laser diode.

In the above circumstances, it had been required to develop a novel gallium nitride based compound semiconductor laser and a method of forming the same.

SUMMARY OF THE INVENTION

Accordingly, it is an object of the present invention to provide a novel gallium nitride based compound semiconductor laser free from the above problems.

It is a further object of the present invention to provide a novel gallium nitride based compound semiconductor laser having a current block layer structure for a current confinement.

It is a still further object of the present invention to provide a novel gallium nitride based compound semiconductor laser having a reduced threshold current.

It is yet a further object of the present invention to provide a novel gallium nitride based compound semiconductor laser having a reduced resistance to current.

It is a further more object of the present invention to provide a novel method of forming a novel gallium nitride-based compound semiconductor laser having a current block layer structure for a current confinement.

It is still more object of the present invention to provide a novel method of forming a novel gallium nitride based compound semiconductor laser having a reduced threshold current.

It is yet more object of the present invention to provide a novel method of forming a novel gallium nitride based compound semiconductor laser having a reduced resistance to current.

It is moreover object of the present invention to provide a novel method of forming a current block layer structure in a novel gallium nitride based compound semiconductor laser without use of dry etching process.

It is still more object of the present invention to provide a novel method of forming a current block layer structure in a novel gallium nitride based compound semiconductor laser at highly accurate size or dimensions.

The above and other objects, feature and advantage of the present invention will be apparent from the following descriptions.

The primary present invention provides a current block layer structure in a semiconductor device. The structure comprises at least a current block layer of a first compound semiconductor having a hexagonal crystal structure. The current block layer are selectively grown on at least a surface of a compound semiconductor region of a second compound semiconductor having the hexagonal crystal structure by use of dielectric stripe masks defining at least a stripe-shaped opening.

The other present invention provides a method of forming a current block layer structure comprising the steps of providing dielectric stripe masks defining at least a stripe-shaped opening on a surface of a compound semiconductor region having a hexagonal crystal structure, and selectively growing at least a current block layer of a compound semiconductor having the hexagonal crystal structure on the surface of the compound semiconductor region by use of the dielectric stripe masks.

Since the current block layer of a compound semiconductor having a hexagonal crystal structure is selectively grown on a compound semiconductor base region also having the hexagonal crystal structure by use of the dielectric stripe masks defining at least a stripe-shaped opening, for example, a metal organic chemical vapor deposition method, then side walls of the current block layer have a good flatness. The selective growth using the dielectric stripe masks results in the highly flat side walls of the current block layer as compared to when a dry etching process is used. The selective growth using the dielectric stripe masks is superior in size-controllability as compared to when a dry etching process is used. The above selective growth using the dielectric stripe masks is more simple than the dry etching process. It is essential for the present invention that the compound semiconductor of the current block layer has the hexagonal crystal structure and the compound semiconductor base region also has the hexagonal crystal structure and also essential that the current block layer is formed by a selective growth using the dielectric stripe masks defining the stripe-shaped opening. Namely, it is important for the present invention that the current block layer of the hexagonal crystal structure compound semiconductor is formed on the hexagonal crystal structure compound semiconductor base region by a selective growth using the dielectric stripe masks defining a stripe-shaped opening such as a metal organic chemical vapor deposition method. The current block layer selectively grown is capable of casing a current confinement or a current concentration which increases a current density whereby a threshold current is reduced if the above current clock structure is applied to a semiconductor laser.

BRIEF DESCRIPTION OF THE DRAWINGS

Preferred embodiments of the present invention will be described in detail with reference to the accompanying drawings.

DISCLOSURE OF THE INVENTION

Figure 1:
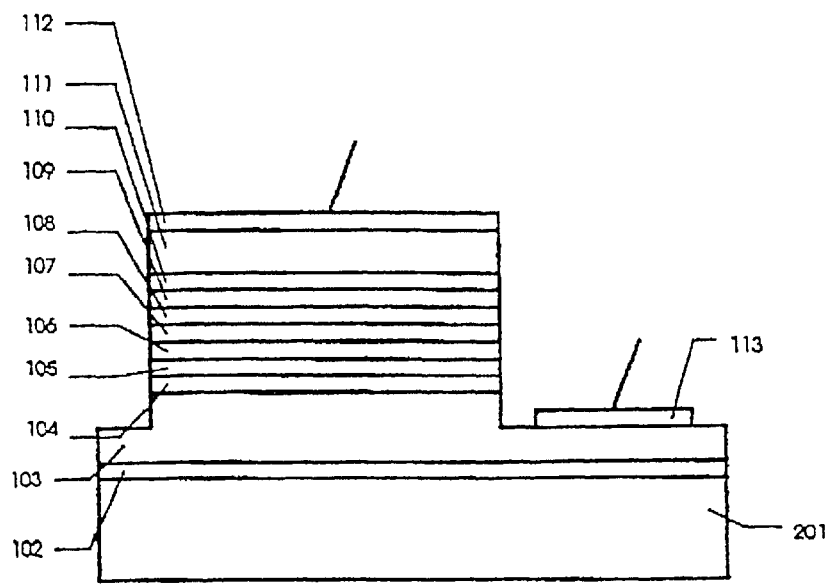
FIG. 1 is a fragmentary cross sectional elevation view illustrative of a conventional gallium nitride based compound semiconductor laser.
Figure 2:
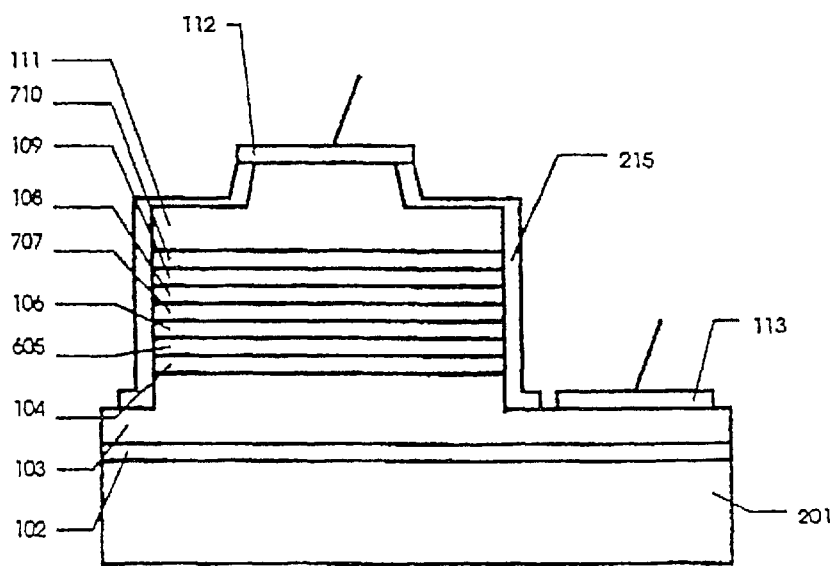
FIG. 2 is a fragmentary cross sectional elevation view illustrative of other conventional gallium nitride based compound semiconductor laser.

The first present invention provides a current block layer structure in a semiconductor device. The structure comprises at least a current block layer of a first compound semiconductor having a hexagonal crystal a structure. The current block layer is selectively grown on at least a surface of a compound semiconductor region of a second compound semiconductor having the hexagonal crystal structure by use of dielectric stripe masks defining at least a stripe-shaped opening.

Since the current block layer of a compound semiconductor having a hexagonal crystal structure is selectively grown on a compound semiconductor base region also having the hexagonal crystal structure by use of the dielectric stripe masks defining at least a stripe-shaped opening, for example, a metal organic chemical vapor deposition method, then side walls of the current block layer have a good flatness. The selective growth using the dielectric stripe masks results in the highly flat side walls of the current block layer as compared to when a dry etching process is used. The selective growth using the dielectric stripe masks is superior in size-controllability as compared to when a dry etching process is used. The above selective growth using the dielectric stripe masks is more simple than the dry etching process. It is essential for the present invention that the compound semiconductor of the current block layer has the hexagonal crystal structure and the compound semiconductor base region also has the hexagonal crystal structure and also essential that the current block layer is formed by a selective growth using the dielectric stripe masks defining the stripe-shaped opening. Namely, it is important for the present invention that the current block layer of the hexagonal crystal structure compound semiconductor is formed on the hexagonal crystal structure compound semiconductor base region by a selective growth using the dielectric stripe masks defining a stripe-shaped opening such as a metal organic chemical vapor deposition method. The current block layer selectively grown is capable of causing a current confinement or a current concentration which increases a current density whereby a threshold current is reduced if the above current clock structure is applied to a semiconductor laser.

The above hexagonal crystal structure may have a (0001)-face or a face tilted from the (0001)-face by an angle in the range of 0 degree to 10 degrees. In this case, the dielectric stripe masks are set so that the strip-shaped opening of the dielectric stripe masks have a longitudinal direction parallel to the [11–20] direction or direction having an included angle to a [11–20] direction in the range of –5 degrees to +5 degrees.

Alternatively, the above hexagonal crystal structure may have a (0001)-face or a face tilted from a (0001)-face by an angle in the range of 0 degree to 10 degrees. In this case, the dielectric stripe masks are set so that the stripe-shaped opening of the dielectric stripe masks have a longitudinal direction parallel to the [1–100 ] direction or direction having an included angle to a [1–100] direction in the range of –5 degrees to +5 degrees.

The compound semiconductor of the current block layer may be of an opposite conductivity type to that of the second compound semiconductor. In this case, the compound semiconductors of the current block layer and the compound semiconductor base region may be gallium nitride based semiconductors, for example, GaN, AlGaN, InGaN and InAlGaN, boron nitride based semiconductors.

Alternatively, the compound semiconductor of the current block layer has a highly resistive compound semiconductor such as an undoped semiconductor. In this cause, the compound semiconductors of the current block layer and the compound semiconductor base region may also be gallium nitride based semiconductors, for example, GaN, AlGaN, InGaN and InAlGaN, boron nitride based semiconductors.

The compound semiconductor region may comprise a compound semiconductor base layer having a flat top surface. In this case, the current block layer is selectively grown on the flat top surface of the compound semiconductor base layer by use of the dielectric stripe masks provided on the flat top surface of the compound semiconductor base layer.

An additional compound semiconductor layer of the same conductivity type as the compound semiconductor base layer may be formed which extends on both side walls and a top surface of the current block layer and also extends over the compound semiconductor base layer under the strip-shaped opening.

Alternatively, laminations of a plurality of additional compound semiconductor layers of the same conductivity type as the compound semiconductor base layer may be formed which extend on both side walls and a top surface of the current block layer and also extend over the compound semiconductor base layer under the strip-shaped opening.

A side wall of the current block layer may be a vertical side wall or a sloped side wall.

The compound semiconductor base region may include at least a flat base portion and at least a ridged portion, and wherein the current block layer is selectively growth both on the flat base portion and on side walls of the ridged portion by use of the dielectric stripe masks provided on a top portion of the ridged portion. The current block layer may comprise a single layer having a top surface which is substantially the same level as the top portion of the ridged portion or may comprise laminations of a plurality of different layers and the laminations have a top surface which is substantially the same level as the top portion of the ridged portion. In the latter case, the laminations may comprise a first layer having an opposite conductivity type to the compound semiconductor region, a second layer being laminated on the first layer and having the same conductivity type as the compound semiconductor region, and a third layer being laminated on the second layer and having the opposite conductivity type to the compound semiconductor region. The ridged portion may include laminations of a plurality of different compound semiconductor layers. The ridged portion and the flat base portion comprise a single compound semiconductor layer having a ridged portion and etched portions.

The second present invention provides a gallium nitride based compound semiconductor laser having a current block layer structure. The current block layer structure comprises current block layers and at least an additional compound semiconductor layer. The current block layers of a first compound semiconductor having a hexagonal crystal structure are selectively grown on a flat top surface of a compound semiconductor base layer of a second compound semiconductor having the hexagonal crystal structure by use of dielectric stripe masks defining at least a stripe-shaped opening and being provided on the flat top surface of the compound semiconductor base layer. The additional compound semiconductor layer of the same conductivity type as the compound semiconductor base layer extends on both side walls and top surfaces of the current block layers and also extends over the compound semiconductor base layer under the stripe-shaped. opening.

Since the current block layer of a compound semiconductor having a hexagonal crystal structure is selectively grown on a compound semiconductor base region also have the hexagonal crystal structure by use of the dielectric stripe masks defining at least a stripe-shaped opening, for example, a metal organic chemical vapor deposition method, then side walls of the current block layer have a good flatness. The selective growth using the dielectric stripe masks results in the highly flat side walls of the current block layer as compared to when a dry etching process is used. The selective growth using the dielectric stripe masks is superior in size-controllability as compared to when a dry etching process is used. The above selective growth using the dielectric shape masks is more simple than the dry etching process. It is essential for the present invention that the compound semiconductor of the current block layer has the hexagonal crystal structure and the compound semiconductor base region also has the hexagonal crystal structure and also essential that the current block layer is formed by a selective growth using the dielectric stripe masks defining the stripe-shaped opening. Namely, it is important for the present invention that the current block layer of the hexagonal crystal structure compound semiconductor is formed on the hexagonal crystal structure compound semiconductor base region by a selective growth using the dielectric stripe masks defining a stripe-shaped opening such as a metal organic chemical vapor deposition method. The current block layer selectively grown is capable of causing a current confinement or a current concentration which increases a current density whereby a threshold current is reduced if the above current clock structure is applied to a semiconductor laser.

The above hexagonal crystal structure may have a (0001)-face or a face tilted from the (0001)-face by an angle in the range of 0 degree to 10 degrees. In this case, the dielectric stripe masks are set so that the stripe-shaped opening of the dielectric stripe masks have a longitudinal direction parallel to the [11–20] direction or direction having an included angle to a [11–20] direction in the range of –5 degrees to +5 degrees.

Alternatively, the above hexagonal crystal structure may have a (0001)-face or a face tilted from a (0001)-face by an angle in the range of 0 degree to 10 degrees. In this case, the dielectric stripe masks are set so that the stripe-shaped opening of the dielectric stripe masks have a longitudinal directional parallel to the [1–100] direction of direction having an included angle to a [1–100] direction in the range of –5 degrees to +5 degrees.

The compound semiconductor of the current block layer may be of an opposite conductivity type to that of the second compound semiconductor. In the case, the compound semiconductors of the current block layer and the compound semiconductor base region may be gallium nitride based semiconductors, for example, GaN, AlGaN, InGaN and InAlGaN, boron nitride based semiconductors.

Alternatively, the compound semiconductor of the current block layer has a highly resistive compound semiconductor such as an undoped semiconductor. In this cause, the compound semiconductors of the current block layer and the compound semiconductor base region may also be gallium nitride based semiconductors, for example, GaN, AlGaN, InGaN and InAlGaN, boron nitride based semiconductors.

The compound semiconductor region may comprise a compound semiconductor base layer having a flat top surface. In this case, the current block layer is selectively grown on the flat top surface of the compound semiconductor base layer by use of the electric stripe masks provided on the flat top surface of the compound semiconductor base layer.

A side wall of the current block layer may be a vertical side wall or a sloped side wall.

The third present invention provides gallium nitride based compound semiconductor laser having a current block layer structure which comprises current block layers of a first compound semiconductor having a hexagonal crystal structure, the current block layers being selectively grown on both a flat base portion and side walls of a ridged portion of a compound semiconductor region of a second compound semiconductor having the hexagonal crystal structure by use of dielectric stripe masks defining at least a stripe-shaped opening and being provided on a top portion of the ridged portion.

Since the current block layer of a compound semiconductor having a hexagonal crystal structure is selectively grown on a compound semiconductor base region also have the hexagonal crystal structure by use of the dielectric stripe masks defining at least a stripe-shaped opening, for example, a metal organic chemical vapor deposition method, then side walls of the current block layer have a good flatness. The selective growth using the dielectric stripe masks results in the highly flat side walls of the current block layer as compared to when a dry etching process is used. The selective growth using the dielectric stripe masks is superior in size-controllability as compared to when a dry etching process is used. The above selective growth using the dielectric stripe masks is more simple than the dry etching process. It is essential for the present invention that the compound semiconductor of the current block layer has the hexagonal crystal structure and the compound semiconductor base region also has the hexagonal crystal structure and also essential that the current block layer is formed by a selective growth using the dielectric stripe masks defining the stripe-shaped opening. Namely, it is important for the present invention that the current block layer of the hexagonal crystal structure compound semiconductor is formed on the hexagonal crystal structure compound semiconductor base region by a selective growth using the dielectric stripe masks defining a stripe-shaped opening such as a metal organic chemical vapor deposition method. The current block layer selectively grown is capable of causing a current confinement or a current concentration which increases a current density whereby a threshold current is reduced if the above current clock structure is applied to a semiconductor laser.

The above hexagonal crystal structure may have a (0001)-face or a face tilted from the (0001)-face by an angle in the range of 0 degree to 10 degrees. In this case, the dielectric stripe masks are set so that the stripe-shaped opening of the dielectric stripe masks have a longitudinal direction parallel to the [11–20] direction or direction having an included angle to a [11–20] direction in the range of −5 degrees to +5 degrees.

Alternatively, the above hexagonal crystal structure may have a (0001)-face or a face tilted from a (0001)-face by an angle in the range of 0 degree to 10 degrees. In this case, the dielectric stripe masks are set so that the stripe-shaped opening of the dielectric stripe masks have a longitudinal direction parallel to the the [1–100] direction having an included angle to a [1–100] direction in the range of −5 degrees to +5 degrees.

The compound semiconductor of the current block layer may be of an opposite conductivity type to that of the second compound semiconductor. In this case, the compound semiconductors of the current block layer and the compound semiconductor base region may be gallium nitride based semiconductors, for example, GaN, AlGaN, InGaN and InAlGaN, boron nitride based semiconductors.

Alternatively, the compound semiconductor of the current block layer has a highly resistive compound semiconductor such as an undoped semiconductor. In this case, the compound semiconductors of the current block layer and the compound semiconductor base region may also be gallium nitride based semiconductors, for example, GaN, AlGaN, InGaN and InAlGaN, boron nitride based semiconductors.

Each of the current block layers may comprise a single layer having a top surface which is substantially the same level as the top portion of the ridged portion.

Alternatively, each of the current block layers may comprise laminations of a plurality of different layers and the laminations have a top surface which is substantially the same level as the top portion of the ridged portion. In this case, the laminations may comprise a first layer having an opposite conductivity type to the compound semiconductor region, a second layer being laminated on the first layer and having the same conductivity type as the compound semiconductor region, and a third layer being laminated on the second layer and having the opposite conductivity type to the compound semiconductor region.

The ridged portion may include laminations of a plurality of different compound semiconductor layers.

The ridged portion and the flat base portion may comprise a single compound semiconductor layer having a ridged portion and etched portions.

The fourth present invention provides a gallium nitride based compound semiconductor laser comprising a substrate, a first $In_xAl_yGa_{1-x-y}N$ ($0 \leq x \leq 1$, $0 \leq y \leq 1$, $0 \leq x+y \leq 1$) layer of a first conductivity type formed over the substrate and the first $In_xAl_yGa_{1-x-y}N$ ($0 \leq x \leq 1$, $0 \leq y \leq 1$, $0 \leq x+y \leq 1$) layer having a hexagonal crystal structure, $In_xGa_{1-x}N$ ($0 \leq x \leq 1$) current block layers having the hexagonal crystal structure being selectively grown on a flat surface of the first $In_xAl_yGa_{1-x-y}N$ ($0 \leq x \leq 1$, $0 \leq y \leq 1$, $0 \leq x+y \leq 1$) layer by use of dielectric stripe masks defining a ridge-shaped opening and being provided on the flat surface of the first $In_xAl_yGa_{1-x-y}N$ ($0 \leq x \leq 1$, $0 \leq y \leq 1$, $0 \leq x+y \leq 1$) layer, a second $In_xAl_yGa_{1-x-y}N$ ($0 \leq x \leq 1$, $0 \leq y \leq 1$, $0 \leq x+y \leq 1$) layer of the first conductivity type being formed which extends on both side walls and top surface of the current block layers and also extends over the first $In_xAl_yGa_{1-x-y}N$ ($0 \leq x \leq 1$, $0 \leq y \leq 1$, $0 \leq x+y \leq 1$) layer, an active region of an $In_xAl_yGa_{1-x-y}N$ ($0 \leq x \leq 1$, $0 \leq y \leq 1$, $0 \leq x+y \leq 1$) compound semicondutor formed over the second $In_xAl_yGa_{1-x-y}N$ ($0 \leq x \leq 1$, $0 \leq y \leq 1$, $0 \leq x+y \leq 1$) layer, and a third $In_xAl_yGa_{1-x-y}N$ ($0 \leq x \leq 1$, $0 \leq y \leq 1$, $0 \leq x+y \leq 1$) layer of a second conductivity type formed over the active region.

The fifth present invention provides a gallium nitride based compound semiconductor laser comprising a substrate, a first $In_xAl_yGa_{1-x-y}N$ ($0 \leq x \leq 1$, $0 \leq y \leq 1$, $0 \leq x+y \leq 1$) layer of a first conductivity type formed over the substrate and the first InAlGaN layer having a hexagonal crystal structure, an active region of an $In_xAl_yGa_{1-x-y}N$ ($0 \leq x \leq 1$, $0 \leq y \leq 1$, $0 \leq x+y \leq 1$) compound semiconductor having the hexagonal crystal structure and being formed over the first $In_xAl_yGa_{1-x-y}N$ ($0 \leq x \leq 1$, $0 \leq y \leq 1$, $0 \leq x+y \leq 1$) layer, a second $In_xAl_yGa_{1-x-y}N$ ($0 \leq x \leq 1$, $0 \leq y \leq 1$, $0 \leq x+y \leq 1$) layer of a second conductivity type being formed on the active region and the second $In_xAl_yGa_{1-x-y}N$ ($0 \leq x \leq 1$, $0 \leq y \leq 1$, $0 \leq x+y \leq 1$) layer having the hexagonal crystal structure, dielectric stripe masks being provided on the second $In_xAl_yGa_{1-x-y}N$ ($0 \leq x \leq 1$, $0 \leq y \leq 1$, $0 \leq x+y \leq 1$) layer and the dielectric stripe masks defining a stripe-shaped opening, and an $In_xGa_{1-x}N$ ($0 \leq x \leq 1$) layer of the second conductivity type having the hexagonal crystal structure being selectively grown by use of the dielectric stripe masks so that the $In_xGa_{1-x}N$ ($0 \leq x \leq 1$) layer extends over the stripe-shaped opening and also extends over parts of the dielectric stripe masks whereby the $In_xGa_{1-x}N$ ($0 \leq x \leq 1$) layer has a ridge-stripe.

The sixth present invention provides a gallium nitride based compound semiconductor laser comprising a substrate, a first $In_xAl_yGa_{1-x-y}N$ ($0 \leq x \leq 1$, $0 \leq y \leq 1$, $0 \leq x+y \leq 1$) layer of a first conductivity type formed over the substrate and the first InAlGaN layer having a hexagonal crystal structure, an active region of an $In_xAl_yGa_{1-x-y}N$ ($0 \leq x \leq 1$, $0 \leq y \leq 1$, $0 \leq x+y \leq 1$) compound semiconductor having the hexagonal crystal structure and being formed over the first $In_xAl_yGa_{1-x-y}N$ ($0 \leq x \leq 1$, $0 \leq y \leq 1$, $0x+y \leq 1$) layer, a second $In_xAl_yGa_{1-x-y}N$ ($0 \leq x \leq 1$, $0 \leq y \leq 1$, $0 \leq x+y \leq 1$) layer of a second conductivity type being formed on the active region and the second $In_xAl_yGa_{1-x-y}N$ ($0 \leq x \leq 1$, $0 \leq y \leq 1$, $0 \leq x+y \leq 1$) layer having the hexagonal crystal structure, $In_xAl_yGa_{1-x-y}N$ ($0 \leq x \leq 1$, $0 \leq y \leq 1$, $0 \leq x+y \leq 1$) current block layers having the hexagonal crystal structure being selectively grown on a flat surface of the second $In_xAl_yGa_{1-x-y}N$ ($0 \leq x \leq 1$, $0 \leq y \leq 1$, $0 \leq x+y \leq 1$) layer by use of dielectric stripe masks defining a ridge-shaped opening and being provided on the flat surface of the second $In_xAl_yGa_{1-x-y}N$ ($0 \leq x \leq 1$, $0 \leq y \leq 1$, $0 \leq x+y \leq 1$) layer, and an $In_xGa_{1-x}N$ ($0 \leq x \leq 1$) layer of the second conductivity type having the hexagonal crystal structure being formed which extends on both side walls and top surfaces of the $In_xAl_yGa_{1-x-y}N$ ($0 \leq x \leq 1$, $0 \leq y \leq 1$, $0 \leq x+y \leq 1$) current block layers and also extends over the second $In_xAl_yGa_{1-x-y}N$ ($0 \leq x \leq 1$, $0 \leq y \leq 1$, $0 \leq x+y \leq 1$) layer.

The seventh present invention provides a gallium nitride based compound semiconductor laser comprising a substrate, a first $In_xAl_yGa_{1-x-y}N$ ($0 \leq x \leq 1$, $0 \leq y \leq 1$, $0 \leq x+y \leq 1$) layer of a first conductivity type being formed on a part of the substrate and the first $In_xAl_yGa_{1-x-y}N$ ($0 \leq x \leq 1$, $0 \leq y \leq 1$, $0 \leq x+y \leq 1$) layer having a hexagonal crystal structure and the first $In_xAl_yGa_{1-x-y}N$ ($0 \leq x \leq 1, 0 \leq y \leq 1$, $0 \leq x+y \leq 1$) layer having a ridged portion, an active region of an $In_xAl_yGa_{1-x-y}N$ ($0 \leq x \leq 1$, $0 \leq y \leq 1$, $0 \leq x+y \leq 1$) compound semiconductor being formed on the ridged portion of the first $In_xAl_yGa_{1-x-y}N$ ($0 \leq x \leq 1$, $0 \leq y1$, $0 \leq x+y \leq 1$) layer, a second $In_xAl_yGa_{1-x-y}N$ ($0 \leq x \leq 1$, $0 \leq y \leq 1$, $0 \leq x+y \leq 1$) layer of a second conductivity type being formed on the active region thereby to form a ridge-structure on the substrate, wherein the ridge-structure comprising laminations of the first $In_xAl_yGa_{1-x-y}N$ ($0 \leq x \leq 1$, $0 \leq y \leq 1$, $0 \leq x+y \leq 1$) layer, the active region and the second $In_xAl_yGa_{1-x-y}N$ ($0 \leq x \leq 1$, $0 \leq y \leq 1$, $0 \leq x+y \leq 1$) layer, $In_xAl_yGa_{1-x-y}N$ ($0 \leq x \leq 1$, $0 \leq y \leq 1$, $0 \leq x+y \leq 1$) current block layers having the hexagonal crystal structure being selectively grown on side walls of the ridged-structure and over the first $In_xAl_yGa_{1-x-y}N$ ($0 \leq x \leq 1$, $0 \leq y \leq 1$, $0 \leq x+y \leq 1$) layer by use of dielectric stripe mask provided on the ridge-structure, and a third $In_xAl_yGa_{1-x-y}N$ ($0 \leq x \leq 1$, $0 \leq y \leq 1$, $0 \leq x+y \leq 1$) layer of second conductivity type being formed over the $In_xAl_yGa_{1-x-y}N$ ($0 \leq x \leq 1$, $0 \leq y \leq 1$, $0 \leq x+y \leq 1$) current block layers and a top of the ridged-structure.

The eighth present invention provides a gallium nitride based compound semiconductor laser comprising a substrate, a first $In_xAl_yGa_{1-x-y}N$ ($0 \leq x \leq 1$, $0 \leq y \leq 1$, $0 \leq x+y \leq 1$) layer of a first conductivity type being formed on the substrate and the first $In_xAl_yGa_{1-x-y}N$ ($0 \leq x \leq 1$, $0 \leq y \leq 1$, $0 \leq x+y \leq 1$) layer having a hexagonal crystal structure and the first $In_xAl_yGa_{1-x-y}N$ ($0 \leq x \leq 1$, $0 \leq y \leq 1$, $0 \leq x+y \leq 1$) layer having a ridged portion, an active region of an $In_xAl_yGa_{1-x-y}N$ ($0 \leq x \leq 1$, $0 \leq y \leq 1$, $0 \leq x+y \leq 1$) compound semiconductor being formed on the first $In_xAl_yGa_{1-x-y}N$ ($0 \leq x \leq 1$, $0 \leq y \leq 1$, $0 \leq x+y \leq 1$) layer, a second $In_xAl_yGa_{1-x-y}N$ ($0 \leq x \leq 1$, $0 \leq y \leq 1$, $0 \leq x+y \leq 1$) layer of second conductivity type being formed on the active region and the second $In_xAl_yGa_{1-x-y}N$ ($0 \leq x \leq 1, 0 \leq y \leq 1, 0 \leq x+y \leq 1$) layer having a ridge portion and flat base portions, $In_xAl_yGa_{1-x-y}N$ ($0 \leq x \leq 1$, $0 \leq y \leq 1$, $0 \leq x+y \leq 1$) current block layers having the hexagonal crystal structure being selectively grown on side walls of the ridge portion and over the flat base portions by use of dielectric stripe mask provided on the ridge portion, and a third $In_xAl_yGa_{1-x-y}N$ ($0 \leq x \leq 1, 0 \leq y \leq 1, 0 \leq x+y \leq 1$) layer of the second conductivity type being formed over the $In_xAl_yGa_{1-x-y}N$ ($0 \leq x \leq 1, 0 \leq y \leq 1$, $0 \leq x+y \leq 1$) current block layers and a top of the ridge portion.

The nine present invention provides a current confinement structure in a semiconductor laser, comprising dielectric stripe masks defining a stripe-shaped opening and being provided on a flat surface of a compound semiconductor base layer having a hexagonal crystal structure, and a compound semiconductor ridge-shaped layer of a hexagonal crystal structure being selectively grown in the stripe-shaped opening over the compound semiconductor base layer as well as over parts of the dielectric stripe masks. The current block layer may selectively be grown by a metal organic chemical vapor deposition method.

Since the compound semiconductor ridge-shaped layer of a compound semiconductor having a hexagonal crystal structure is selectively grown on a compound semiconductor base region also having the hexagonal crystal structure by use of the dielectric stripe masks defining at least a stripe-shaped opening, for example, a metal organic chemical vapor deposition method, then side walls of the compound semiconductor ridge-shaped layer have a good flatness. The selective growth using the dielectric stripe masks results in the highly flat side walls of the current block layer as compared to when a dry etching process is used. The selective growth using the dielectric stripe masks is superior in size-controllability as compared to when a dry etching process is used. The above selective growth using the dielectric stripe masks is more simple than the dry etching process. It is essential for the present invention that the compound semiconductor of the compound semiconductor ridge-shaped layer has the hexagonal crystal structure and the compound semiconductor base region also has the hexagonal crystal structure and also essential that the compound semiconductor ridge-shaped layer is formed by a selective growth using the dielectric stripe masks defining the stripe-shaped opening. Namely, it is important for the present invention that the compound semiconductor ridge-shaped layer of the hexagonal crystal structure is formed on the hexagonal crystal structure compound semiconductor base region by a selective growth using the dielectric stripe masks defining a stripe-shaped opening such as a metal organic chemical vapor deposition method. The current block layer selectively grown is cable of causing a current confinement or a current concentration which increases a current density whereby a threshold current is reduced if the above compound semiconductor ridge-shaped layer is applied to a semiconductor laser.

The above hexagonal crystal structure may have a (0001)-face or a face tilted from the (0001)-face by an angle in the range of 0 degree to 10 degrees. In this case, the dielectric stripe masks are set so that the stripe-shaped opening of the dielectric stripe masks have a longitudinal direction parallel to the [11–20] direction or direction having an included angle to a [11–20] direction in the range of –5 degrees to +5 degrees.

Alternatively, the above hexagonal crystal structure may have a (0001)-face or a face tilted from a (0001)-face by an angle in the range of 0 degree to 10 degrees. In this case, the dielectric stripe masks are set so that the stripe-shaped opening of the dielectric stripe masks have a longitudinal direction parallel to the [1–100] direction or direction having an included angle to a [1–100] direction in the range of –5 degrees to +5 degrees.

The tenth present invention provides a method of forming a current block layer structure comprising the steps of providing dielectric stripe masks defining at least a stripe-shaped opening on a surface of a compound semiconductor region having a hexagonal crystal structure, and selectively growing at least a current block layer of a compound semiconductor having the hexagonal crystal structure on the surface of the compound semiconductor region by use of the dielectric stripe masks.

Since the current block layer of a compound semiconductor having a hexagonal crystal structure is selectively grown on a compound semiconductor base region also having the hexagonal crystal structure by use of the dielectric stripe masks defining at least a stripe-shaped opening, for example, a metal organic chemical vapor deposition method, then side walls of the current block layer have a good flatness. The selective growth using the dielectric stripe masks results in the highly flat side walls of the current block layer as compared to when a dry etching process is used. The selective growth using the dielectric stripe masks is superior is size-controllability as compared to when a dry etching process is used. The above selective growth using the dielectric stripe masks is more simple than the dry etching process. It is essential for the present invention that the compound semiconductor of the current block layer has the hexagonal crystal structure and the compound semiconductor base region also has the hexagonal crystal structure and also essential that the current block layer is formed by a selective growth using the dielectric stripe masks defining the stripe-shaped opening. Namely, it is important for the present invention that the current block layer of the hexagonal crystal structure compound semiconductor is formed on the hexagonal crystal structure compound semiconductor base region by a selective growth using the dielectric stripe masks defining a stripe-shaped opening such as a metal organic chemical vapor deposition method. The current block layer selectively grown is capable of causing a current confinement or a current concentration which increases a current density whereby a threshold current is reduced if the above current clock structure is applied to a semiconductor laser.

The above hexagonal crystal structure may have a (0001)-face or a face tilted from the (0001)-face by an angle in the range of 0 degree to 10 degrees. In this case, the dielectric stripe masks are set so that the stripe-shaped opening of the dielectric stripe masks have a longitudinal direction parallel to the [11–20] direction or direction having an included angle to a [11–20] direction in the range of –5 degrees to +5 degrees.

Alternatively, the above hexagonal crystal structure may have a (0001)-face or face tilted from a (0001)-face by an angle in the range of 0 degree to 10 degrees. In this case, the dielectric stripe masks are set so that the stripe-shaped opening of the dielectric stripe masks have a longitudinal direction parallel to the [1–100] direction or direction having an included angle to a [1–100] direction in the range of –5 degrees to +5 degrees.

The compound semiconductor of the current block layer may be of an opposite conductivity type to that of the compound semiconductor region. In this case, the method as claimed in claim 108, wherein the compound semiconductor of the current block layer and the compound semiconductor region may be gallium nitride based semiconductors or boron nitride based semiconductors.

Alternatively, the compound semiconductor of the current block layer may have a highly resistive compound semiconductor such as an undoped semiconductor.

The compound semiconductor region may comprise a compound semiconductor base layer having a flat top surface, and wherein the current block layer is selectively grown on the flat top surface of the compound semiconductor base layer by use of the dielectric stripe masks provided on the flat top surface of the compound semiconductor base layer.

An additional compound semiconductor layer of the same conductivity type as the compound semiconductor base layer may further be formed so that the additional compound semiconductor layer extends on both side walls and a top surface of the current block layer and also extends over the compound semiconductor base layer under the stripe-shaped opening under the stripe-shaped opening.

Alternatively, laminations of a plurality of additional compound semiconductor layers of the same conductivity type as the compound semiconductor base layer may further be formed so that the laminations of the plurality of additional compound semiconductor layers extend on both side walls and a top surface of the current block layer and also extend over the compound semiconductor base layer under the stripe-shaped opening.

The compound semiconductor region may include at least a flat base portion and at least a ridged portion, and wherein the current block layer is selectively grown both on the flat base portion and on side walls of the ridged portion by use of the dielectric stripe masks provided on a top portion of the ridged portion.

Alternatively, the current block layer may comprise a single layer having a top surface which is substantially the same level as the top portion of the ridged portion.

Further alternatively, the current block layer may comprise laminations of a plurality of different layers and the laminations have a top surface which is substantially the same level as the top portion of the ridged portion. In this case, the laminations are formed by depositing a first layer having an opposite conductivity type to the compound semiconductor region, depositing a second layer being laminated on the first layer and having the same conductivity type as the compound semiconductor region over the first layer, and a third layer being laminated on the second layer and having the opposite conductivity type to the compound semiconductor region over the second layer.

The eleventh present invention provides a method of forming a current block layer structure in a gallium nitride based compound semiconductor laser, comprising the steps of providing dielectric stripe masks defining at least a stripe-shaped opening on a flat surface of a compound semiconductor region having a hexagonal crystal structure, selectively growing at least a ridge-shaped current block layer of a compound semiconductor having the hexagonal crystal structure on the surface of the compound semiconductor region by use of the dielectric stripe masks, and forming at least an additional compound semiconductor layer of the same conductivity type as the compound semiconductor base layer so that the additional compound semiconductor layer extends on both side walls and a top surface of the current block layer and also extends over the compound semiconductor base layer under the stripe-shaped opening under the stripe-shaped opening. The current block layer may selectively be grown by a metal organic chemical vapor deposition method.

Since the current block layer of a compound semiconductor having a hexagonal crystal structure is selectively grown on a compound semiconductor base region also having the hexagonal crystal structure by use of the dielectric stripe masks defining at least a stripe-shaped opening, for example, a metal organic chemical vapor deposition method, then side walls of the current block layer have a good flatness. The selective growth using the dielectric stripe masks results in the highly flat side walls of the current block layer as compared to when a dry etching process is used. The selective growth using the dielectric stripe masks is superior in size-controllability as compared to when a dry etching process is used. The above selective growth using the dielectric stripe masks is more simple than the dry etching process. It is essential for the present invention that the compound semiconductor of the current block layer has the hexagonal crystal structure and the compound semiconductor base region also has the hexagonal crystal structure and also essential that the current block layer is formed by a selective growth using the dielectric stripe masks defining the stripe-shaped opening. Namely, it is important for the present invention that the current block layer of the hexagonal crystal structure compound semiconductor is formed on the hexagonal crystal structure compound semiconductor base region by a selective growth using the dielectric stripe masks defining a stripe-shaped opening such as a metal organic chemical vapor deposition method. The current block layer selectively grown is capable of causing a current confinement or a current concentration which increases a current density whereby a threshold current is reduced if the above current clock structure is applied to a semiconductor laser.

The above hexagonal crystal structure may have a (0001)-face or a face tilted from the (0001)-face by an angle in the range of 0 degree to 10 degrees. In this case, the dielectric stripe masks are set so that the stripe-shaped opening of the dielectric stripe masks have a longitudinal direction parallel to the [11–20] direction or direction having an included angle to a [11–20] direction in the range of –5 degrees to +5 degrees.

Alternatively, the above hexagonal crystal structure may have a (0001)-face or a face tilted from a (0001)-face by an angle in the range of 0 degree to 10 degrees. In this case, the dielectric stripe masks are set so that the stripe-shaped opening of the dielectric stripe masks have a longitudinal direction parallel to the [1–100] direction or direction having an included angle to a [1–100] direction in the range of –5 degrees to +5 degrees.

The compound semiconductor of the current block layer may be of an opposite conductivity type to that of the compound semiconductor region.

The compound semiconductor of the current block layer and the compound semiconductor region may be gallium nitride based semiconductors or boron nitride based semiconductors.

The compound semiconductor of the current block layer may have a highly resistive compound semiconductor such as an undoped semiconductor.

The twelfth present invention provides a method of forming a current block layer structure in a gallium nitride based compound semiconductor laser, comprising the steps of forming flat base portions and ridged portions of a compound semiconductor region, providing dielectric stripe masks defining at least a stripe-shaped opening on the ridged portion of the compound semiconductor region having a hexagonal crystal structure, structure, and selectively growing at least a current block layer of a compound semiconductor having the hexagonal crystal structure both on the flat base portion and on side walls of the ridged portion by use of the dielectric stripe masks. The current block layer is selectively grown by a metal organic chemical vapor deposition method.

Since the current block layer of a compound semiconductor having a hexagonal crystal structure is selectively grown on a compound semiconductor base region also having the hexagonal crystal structure by use of the dielectric stripe masks defining at least a stripe-shaped opening, for example, a metal organic chemical vapor deposition method, then side walls of the current block layer have a good flatness. The selective growth using the dielectric stripe masks results in the highly flat side walls of the current block layer as compared to when a dry etching process is used. The selective growth using the dielectric stripe masks is superior in size-controllability as compared to when a dry etching process is used. The above selective growth using the dielectric stripe masks is more simple than the dry etching process. It is essential for the present invention that the compound semiconductor of the current block layer has the hexagonal crystal structure and the compound semiconductor base region also has the hexagonal crystal structure and also essential that the current block layer is formed by a selective growth using the dielectric stripe masks defining the stripe-shaped opening. Namely, it is important for the present invention that the current block layer of the hexagonal crystal structure compound semiconductor is formed on the hexagonal crystal structure compound semiconductor base region by a selective growth using the dielectric stripe masks defining a stripe-shaped opening such as a metal organic chemical vapor deposition method. The current block layer selectively grown is capable of causing a current confinement or a current concentration which increases a current density whereby a threshold current is reduced if the above current clock structure is applied to a semiconductor laser.

The above hexagonal crystal structure may have a (0001)-face or a face tilted from the (0001)-face by an angle in the range of 0 degree to 10 degrees. In this case, the dielectric stripe masks are set so that the stripe-shaped opening of the dielectric stripe masks have a longitudinal direction parallel to the [11–20] direction or direction having an included angle to a [11–20] direction in the range of –5 degrees to +5 degrees.

Alternatively, the above hexagonal crystal structure may have a (0001)-face or a face tilted from a (0001)-face by an angle in the range of 0 degree to 10 degrees. In this case, the dielectric stripe masks are set so that the stripe-shaped opening of the dielectric stripe masks have a longitudinal direction parallel to the [1–100] direction or direction having an included angle to a [1–100] direction in the range of –5 degrees to +5 degrees.

The compound semiconductor of the current block layer may be of an opposite conductivity type to that of the compound semiconductor region.

The compound semiconductor of the current block layer and the compound semiconductor region may be gallium nitride based semiconductors or boron nitride based semiconductors.

The compound semiconductor of the current block layer may have a highly resistive compound semiconductor such as an undoped semiconductor.

The current block layer may comprise a single layer having a top surface which is substantially the same level as the top portion of the ridged portion.

The current block layer may also comprise laminations of a plurality of different layers and the laminations have a top surface which is substantially the same level as the top portion of the ridged portion. In this case, the laminations may be formed by depositing a first layer having an opposite conductivity type to the compound semiconductor region, depositing a second layer being laminated on the first layer and having the same conductivity type as the compound semiconductor region over the first layer, and a third layer being laminated on the second layer and having the opposite conductivity type to the compound semiconductor region over the second layer.

The thirteenth present invention provides a method of forming a current confinement structure in a gallium nitride based compound semiconductor laser, comprising the steps of providing dielectric stripe masks defining at least a stripe-shaped opening on a flat surface of a compound semiconductor region having a hexagonal crystal structure, and selectively growing a compound semiconductor ridge-shaped layer of a hexagonal crystal structure in the stripe-shaped opening over the compound semiconductor base layer as well as over parts of the dielectric stripe masks. The compound semiconductor ridge-shaped layer may selectively be grown by a metal organic chemical vapor deposition method.

Since the current block layer of a compound semiconductor having a hexagonal crystal structure is selectively grown on a compound semiconductor base region also having the hexagonal crystal structure by use of the dielectric stripe masks defining at least a stripe-shaped opening, for example, a metal organic chemical vapor deposition method, then side walls of the compound semiconductor ridge-shaped layer have a good flatness. The selective growth using the dielectric stripe masks results in the highly flat side walls of the compound semiconductor ridge-shaped layer as compared to when a dry etching process is used. The selective growth using the dielectric stripe masks is superior in size-controllability as compared to when a dry etching process is used. The above selective growth using the dielectric stripe masks is more simple than the dry etching process. It is essential for the present invention that the compound semiconductor of the compound semiconductor ridge-shaped layer has the hexagonal crystal structure and the compound semiconductor base region also has the hexagonal crystal structure and also essential that the compound semiconductor ridge-shaped layer is formed by a selective growth using the dielectric stripe masks defining the stripe-shaped opening. Namely, it is important for the present invention that the compound semiconductor ridge-shaped layer of the hexagonal crystal structure compound semiconductor is formed on the hexagonal crystal structure compound semiconductor base region by a selective growth using the dielectric stripe masks defining a stripe-shaped opening such as a metal organic chemical vapor deposition method. The compound semiconductor ridge-shaped layer selectively grown is capable of causing a current confinement or a current concentration which increases a current density whereby a threshold current is reduced if the above current clock structure is applied to a semiconductor laser.

The above hexagonal crystal structure may have a (0001)-face or a face tilted from the (0001)-face by an angle in the range of 0 degree to 10 degrees. In this case, the dielectric stripe masks are set so that the stripe-shaped opening of the dielectric stripe masks have a longitudinal direction parallel to the [11–20] direction or direction having an included angle to a [11–20] direction in the range of –5 degrees to +5 degrees.

Alternatively, the above hexagonal crystal structure may have a (0001)-face or a face tilted from a (0001)-face by an angle in the range of 0 degree to 10 degrees. In this case, the dielectric stripe masks are set so that the stripe-shaped opening of the dielectric stripe masks have a longitudinal direction parallel to the [1–100] direction or direction having an included angle to a [1–100] direction in the range of –5 degrees to +5 degrees.

The compound semiconductor region and the compound semiconductor ridge-shaped layer may be made of one selected from the group consisting of gallium nitride based semiconductors and boron nitride based semiconductors.

PREFERRED EMBODIMENTS

First Embodiment

Figure 3:
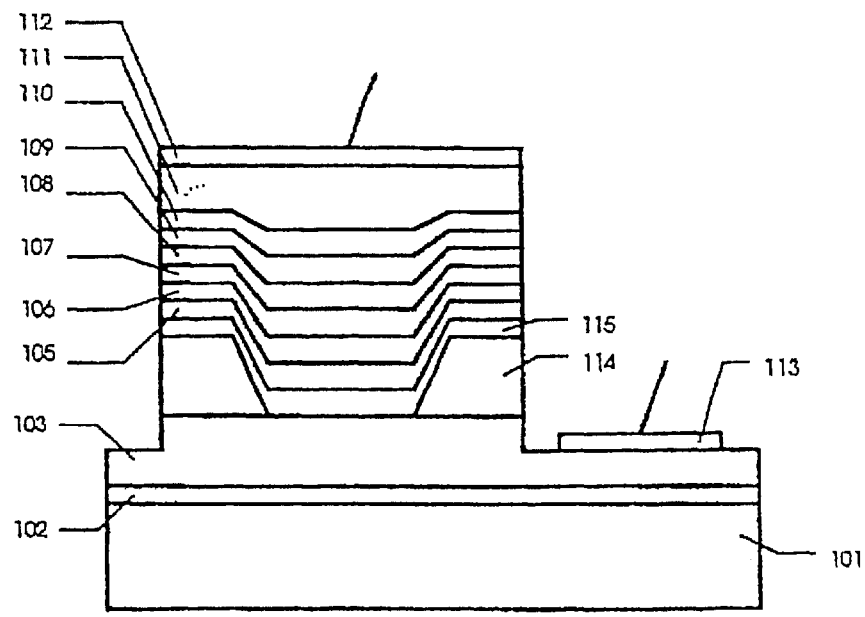
FIG. 3 is a fragmentary cross sectional elevation view illustrative of a novel gallium nitride based compound semiconductor laser having a current block layer structure for a current confinement in a first embodiment according to the present invention.
Figure 4:
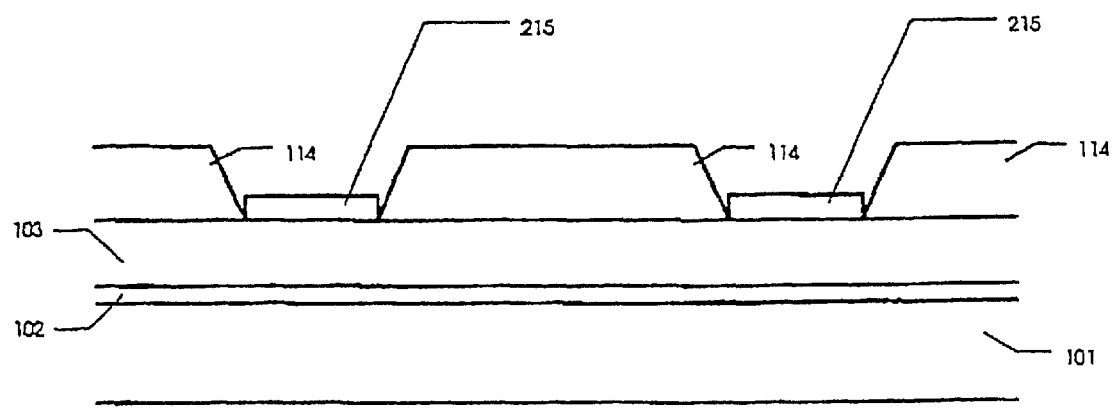
FIG. 4 is a fragmentary cross sectional elevation view illustrative of a novel gallium nitride based compound semiconductor laser in a selective growth process by a metal organic chemical vapor deposition method involved in a fabrication method thereof.

A first embodiment according to the present invention will be described with reference to FIGS. 3 and 4. FIG. 3 is a fragmentary cross sectional elevation view illustrative of a novel gallium nitride based compound semiconductor laser having a current block layer structure for a current confinement in a first embodiment according to the present invention. FIG. 4 is a fragmentary cross sectional elevation view illustrative of a novel gallium nitride based compound semiconductor laser in a selective growth process by a metal organic chemical vapor deposition method involved in a fabrication method thereof.

The novel gallium nitride based compound semiconductor laser is formed on a (0001)-face sapphire substrate 101. All of the compound semiconductor layers in the novel gallium nitride based compound semiconductor have hexagonal crystal structures. The structure of the novel gallium nitride based compound semiconductor laser is as follows. A 300 Å-thick undoped GaN buffer layer 102 is provided on a (0001)-face sapphire substrate 101. The 300 Å-thick undoped GaN buffer layer 102 has a hexagonal crystal structure. A 3 μm-thick n-type GaN contact layer 103 doped with Si is provided on an entire surface of the 300 Å-thick undoped GaN buffer layer 102. The 3 μm-thick n-type GaN contact layer 103 has a hexagonal crystal structure. The 3 μm-thick n-type GaN contact layer 103 has a ridged portion and recess portions. A top surface of the ridged portion of the 3 μm-thick n-type GaN contact layer 103 is a flat surface. Upper surfaces of the recess portions of the 3 μm-thick n-type GaN contact layer 103 are also flat surfaces. Further, 0.5 μm-thick p-type GaN current block layers 114 doped with Mg are selectively provided on the top flat surface of the ridged portion of the 3 μm-thick n-type GaN contact layer 103. The 0.5 μm-thick p-type GaN current block layers 114 also have the hexagonal crystal structure. As will be described later, the 0.5 μm-thick p-type GaN current block layers 114 are formed by a selective growth of a metal organic chemical vapor deposition method using dielectric stripe masks, for which reason the 0.5 μm-thick p-type GaN current block layers 114 have highly flat and sloped inside walls. It is important that the 0.5 μm-thick p-type GaN current block layers 114 having the hexagonal crystal structure are selectively grown by the metal organic chemical vapor deposition method using dielectric stripe masks on the 3 μm-thick n-type GaN contact layer 103 having the hexagonal crystal structure. This results in the formation of the highly flat and sloped inside walls of the 0.5 μm-thick p-type GaN current block layers 114. The highly flat and sloped inside walls of the 0.5 μm-thick p-type GaN current block layers 114 cause current confinement as will be described later. A 0.1 μm-thick n-type GaN cladding layer 115 doped with Si is then provided which extends on the top and flat surfaces and the above highly flat sloped inside walls of the 0.5 μm-thick p-type GaN current block layers 114 as well as on an uncovered part of a top surface of the 3 μm-thick n-type GaN contact layer 103. The 0.1 μm-thick n-type GaN cladding layer 115 has the hexagonal crystal structure. A 0.4 μm-thick n-type $Al_{0.07}Ga_{0.93}N$ cladding layer 105 doped with Si is provided on the 0.1 μm-thick n-type GaN cladding layer 115. The 0.4 μm-thick n-type $Al_{0.07}Ga_{0.93}N$ cladding layer 105 has the hexagonal crystal structure. A 0.1 μm-thick n-type GaN optical guide layer 106 doped with Si is provided on the 0.4 μm-thick n-type $Al_{0.07}Ga_{0.93}N$ cladding layer 105. The 0.1 μm-thick n-type GaN optical guide layer 106 has the hexagonal crystal structure. A multiple quantum well active layer 107 is provided on the 0.1 μm-thick n-type GaN optical guide layer 106. The multiple quantum well active layer 107 comprises 7 periods of alternating 25 Å-thick undoped $In_{0.2}Ga_{0.8}N$ quantum well layers and 50 Å-thick undoped $In_{0.05}Ga_{0.95}N$ barrier layers. The 25

Å-thick undoped $In_{0.2}Ga_{0.8}N$ quantum well layers have the hexagonal crystal structure. The 50 Å-thick undoped $In_{0.05}Ga_{0.95}N$ barrier layers have the hexagonal crystal structure structure. A 200 Å-thick p-type $Al_{0.2}Ga_{0.8}N$ layer 108 doped with Mg is provided on the multiple quantum well active layer 107. The 200 Å-thick p-type $Al_{0.2}Ga_{0.8}N$ layer 108 has the hexagonal crystal structure. A 0.1 μm-thick p-type GaN optical guide layer 109 doped with Mg is provided on the 200 Å-thick p-type $Al_{0.2}Ga_{0.8}N$ layer 108. The 0.1 μm-thick p-type GaN optical guide layer 109 has the hexagonal crystal structure. A 0.4 μm-thick p-type $Al_{0.07}Ga_{0.93}N$ cladding layer 110 doped with Mg is provided on the 0.1 μm-thick p-type GaN optical guide layer 109. The 0.4 μm-thick p-type $Al_{0.07}Ga_{0.93}N$ cladding layer 110 has the hexagonal crystal structure. There are differences in level of the 0.1 μm-thick n-type GaN cladding layer 115, the 0.4 μm-thick n-type $Al_{0.07}Ga_{0.93}N$ cladding layer 105, the 0.1 μm-thick n-type GaN optical guide layer 106, the multiple quantum well active layer 107, the 200 Å-thick p-type $Al_{0.2}Ga_{0.8}N$ layer 108, the 0.1 μm-thick p-type GaN optical guide layer 109 and the 0.4 μm-thick p-type $Al_{0.07}Ga_{0.93}N$ cladding layer 110. A 0.2 μm-thick p-type GaN contact layer 111 doped with Mg is provided on the 0.4 μm-thick p-type $Al_{0.07}Ga_{0.93}N$ cladding layer 110. A top surface of 0.2 μm-thick p-type GaN contact layer 111 is flat. The 0.2 μm-thick p-type GaN contact layer 111 has the hexagonal crystal structure. A p-electrode 112 is provided on the top flat surface of the 0.2 μm-thick p-type GaN contact layer 111. The p-electrode 112 comprises a nickel layer laminated on the top flat surface of the 0.2 μm-thick p-type GaN contact layer 111 and a gold layer laminated on the nickel layer. An n-electrode 113 is provided on the recessed surface of the 3 μm-thick n-type GaN contact layer 103. The n-electrode 113 comprises a titanium layer laminated on the 3 μm-thick n-type GaN contact layer 103 and an aluminum layer laminated on the titanium layer.

As described above, since the 0.5 μm-thick p-type GaN current block layers 114 have an opposite conductivity type to that of the 3 μm-thick n-type GaN contact layer 103 and the 0.1 μm-thick n-type GaN cladding layer 115 as well as the 0.4 μm-thick n-type $Al_{0.07}Ga_{0.93}N$ cladding layer 105, then the 0.5 μm-thick p-type GaN current block layers 114 are capable of blocking or guiding a current for current confinement. This current confinement allows a reduction in threshold current of the laser diode.

The above laser diode is formed as follows. The 300 Å-thick undoped GaN buffer layer 102 is grown by a metal organic chemical vapor deposition method at a low temperature on the flat (0001)-face sapphire substrate 101 so that the 300 Å-thick undoped GaN buffer layer 102 has a hexagonal crystal structure. The 3 μm-thick n-type GaN contact layer 103 doped with Si is grown by a metal organic chemical vapor deposition method on an entire surface of the 300 Å-thick undoped GaN buffer layer 102 so that the 3 μm-thick n-type GaN contact layer 103 has a hexagonal crystal structure. Silicon oxide stripe masks 215 having a width of 1 micrometer are arranged in a [11–20] direction of the hexagonal crystal structure of the 3 μm-thick n-type GaN contact layer 103. The silicon oxide stripes masks 215 define stripe-shaped openings. The 0.5 μm-thick p-type GaN current block layers 114 doped with Mg are selectively grown on the top flat surface of the ridged portion of the 3 μm-thick n-type GaN contact layer 103 by the metal organic chemical vapor deposition method using the silicon oxide stripe masks 215. Namely, the 0.5 μm-thick p-type GaN current block layers 114 are selectively grown only on the stripe-shaped openings defined by silicon oxide stripe masks 215. The 0.5 μm-thick p-type GaN current block layers 114 also have the hexagonal crystal structure. Since the 0.5 μm-thick p-type GaN current block layers 114 are grown by a selective growth of the metal organic chemical vapor deposition method using dielectric stripe masks, the 0.5 μm-thick p-type GaN current block layers 114 have highly flat and sloped inside walls. It is important that the 0.5 μm-thick p-type GaN current block layers 114 having the hexagonal crystal structure are selectively grown by the metal organic chemical vapor deposition method using dielectric stripe masks on the 3 μm-thick n-type GaN contact layer 103 having the hexagonal crystal structure. This results in the formation of the highly flat and sloped inside walls of the 0.5 μm-thick p-type GaN current block layers 114. The highly flat and sloped inside walls of the 0.5 μm-thick p-type GaN current block layers 114 cause current confinement. The used silicon oxide stripe masks 215 are removed by a florin acid solution. The 0.1 μm-thick n-type GaN cladding layer 115 doped with Si is then grown by the metal organic chemical vapor deposition so that the 0.1 μm-thick n-type GaN cladding layer 115 extends on the top and flat surfaces and the above highly flat sloped inside walls of the 0.5 μm-thick p-type GaN current block layers 114 as well as on an uncovered part of a top surface of the 3 μm-thick n-type GaN contact layer 103. The 0.1 μm-thick n-type GaN cladding layer 115 also has the hexagonal crystal structure. The 0.4 μm-thick n-type $Al_{0.07}Ga_{0.93}N$ cladding layer 105 doped with Si is grown by the metal organic chemical vapor deposition on the 0.1 μm-thick n-type GaN cladding layer 115 so that the 0.4 μm-thick n-type $Al_{0.07}Ga_{0.93}N$ cladding layer 105 has the hexagonal crystal structure. The 0.1 μm-thick n-type GaN optical guide layer 106 doped with Si is grown by the metal organic chemical vapor deposition on the 0.4 μm-thick n-type $Al_{0.07}Ga_{0.93}N$ cladding layer 105 so that the 0.1 μm-thick n-type GaN optical guide layer 106 has the hexagonal crystal structure. The multiple quantum well active layer 107 is grown by the metal organic chemical vapor deposition on the 0.1 μm-thick n-type GaN optical guide layer 106, wherein the multiple quantum well active layer 107 comprises 7 periods of alternating 25 Å-thick undoped $In_{0.2}Ga_{0.8}N$ quantum well layers and 50 Å-thick undoped $In_{0.05}Ga_{0.95}N$ barrier layers. The 25 Å-thick undoped $In_{0.2}Ga_{0.8}N$ quantum well layers and the 50 Å-thick undoped $In_{0.05}Ga_{0.95}N$ barrier layers have the hexagonal crystal structure. The 200 Å-thick p-type $Al_{0.2}Ga_{0.8}N$ layer 108 doped with Mg is grown by the metal organic chemical vapor deposition on the multiple quantum well active layer 107 so that the 200 Å-thick p-type $Al_{0.2}Ga_{0.8}N$ layer 108 has the hexagonal crystal structure. The 200 Å-thick p-type $Al_{0.2}Ga_{0.8}N$ layer 108 is capable of preventing dissociation of indium from the multiple quantum well active layer 107. The 0.1 μm-thick p-type GaN optical guide layer 109 doped with Mg is grown by the metal organic chemical vapor deposition on the 200 Å-thick p-type $Al_{0.2}Ga_{0.8}N$ layer 108 so that the 0.1 μm-thick p-type GaN optical guide layer 109 has the hexagonal crystal structure. The 0.4 μm-thick p-type $Al_{0.07}Ga_{0.93}N$ cladding layer 110 doped with Mg is grown by the metal organic chemical vapor deposition on the 0.1 μm-thick p-type GaN optical guide layer 109 so that the 0.4 μm-thick p-type $Al_{0.07}Ga_{0.93}N$ cladding layer 110 has the hexagonal crystal structure. The 0.2 μm-thick p-type GaN contact layer 111 doped with Mg is grown by the metal organic chemical vapor deposition on the 0.4 μm-thick p-type $Al_{0.07}Ga_{0.93}N$ cladding layer 110 so that the 0.2 μm-thick p-type GaN contact layer 111 has the hexagonal crystal structure. The nickel layer is formed on the top flat surface of the 0.2

μm-thick p-type GaN contact layer 111 and a gold layer is then formed on the nickel layer thereby forming the p-electrode 112. A titanium layer is formed on the 3 μm-thick n-type GaN contact layer 103 and an aluminum layer is then formed on the titanium layer.

Since the 0.5 μm-thick p-type GaN current block layers 114 have an opposite conductivity type to that of the 3 μm-thick n-type GaN contact layer 103 and the 0.1 μm-thick n-type GaN cladding layer 115 as well as the 0.4 μm-thick n-type $Al_{0.07}Ga_{0.93}N$ cladding layer 105, then the 0.5 μm-thick p-type GaN current block layers 114 are capable of blocking or guiding a current for current confinement. This current confinement allows a reduction in threshold current of the laser diode.

Since further, the p-electrode 112 has a large contact area with the 0.2 μm-thick p-type GaN contact layer 111, a contact resistance between the p-electrode 112 and the 0.2 μm-thick p-type GaN contact layer 111 is small.

Furthermore, the above current confinement structure can be formed without use of the dry etching process.

Moreover, there are the differences in level of the 0.1 μm-thick n-type GaN cladding layer 115, the 0.4 μm-thick n-type $Al_{0.07}Ga_{0.93}N$ cladding layer 105, the 0.1 μm-thick n-type GaN optical guide layer 106, the multiple quantum well active layer 107, the 200 Å-thick p-type $Al_{0.2}Ga_{0.8}N$ layer 108, the 0.1 μm-thick p-type GaN optical guide layer 109 and the 0.4 μm-thick p-type $Al_{0.07}Ga_{0.93}N$ cladding layer 110. This configuration forms that the cladding layers are positioned at the right and left sides of the active layer so that an optical control in the transverse mode can be made.

Since the gallium nitride based compound semiconductor layers having the hexagonal crystal structure are selectively formed on the (0001)-face of the gallium nitride layer, then the gallium nitride based compound semiconductor layers are almost not grown in the [1–100] direction.

Namely, the p-type gallium nitride current block layers 114 having the hexagonal structure are selectively grown on the (0001)-face of the n-type gallium nitride layer 103 having the hexagonal crystal structure by use of the dielectric stripe masks arranged in a longitudinal direction along the [11–20] direction so that no extending portion over the dielectric stripe masks is formed.

In the above gallium nitride based compound semiconductor laser diode, an optical waveguide is formed in a direction along the [11–20] direction of the crystal structure. It is difficult to cleave the semiconductor wafer in the [11–20] direction. This means it difficult to form the reflective faces of resonator in the laser diode by the cleaving method. For this reason, it is necessary to form the reflective faces of resonator in the laser diode by other method such as dry etching.

As a modification, the optical waveguide may be formed in a direction tilted from the [11–20] direction of the crystal structure by an angle in the range of ±5 degrees. Even if the optical waveguide is formed in a direction tilted from the [11–20] direction of the crystal structure by an angle over the range of ±5 degrees, then there is no problem unless the semiconductor layer is allowed to be selectively grown in the [11–20] direction. In the later case, however, it is necessary that the dielectric strip masks are almost the same in thickness as the current block layers.

Whereas in the above embodiment the semiconductor layers having the hexagonal crystal structure are grown on the (0001)-face of the sapphire substrate, it is also possible to grow the semiconductor layers having the hexagonal crystal structure on the (11–20)-face of the sapphire substrate.

Further, in place of the (0001)-face sapphire substrate and the (11–20)-face sapphire substrate, silicon oxide substrates with the (0001)-face or the (11–20)-face are available. Furthermore, $MgAl_2O_4$ substrates with the (0001)-face or the (11–20)-face are also available. Gallium nitride substrates with the (0001)-face or the (11–20)-face are still further available. The sapphire substrate, silicon oxide substrate, $MgAl_2O_4$ substrate, and gallium nitride substrate having other faces than the (0001)-face or the (11–20)-face are also available.

The above present invention can be applied not only to the gallium nitride based laser diode as illustrated in the drawings but also other gallium nitride based laser diodes which are different in thickness of layer, composition of layer, doping concentration of layer, material of electrode, martial of dielectric stripe masks, depth of dry etching, and width of stripe of the dielectric stripe masks.

Although in the above embodiment, the individual semiconductor layers have surfaces of the (0001)-face, the surfaces of the individual semiconductor layers may be tilted from the (0001)-face by an angle in the range of ±5 degrees.

Second Embodiment

Figure 5:
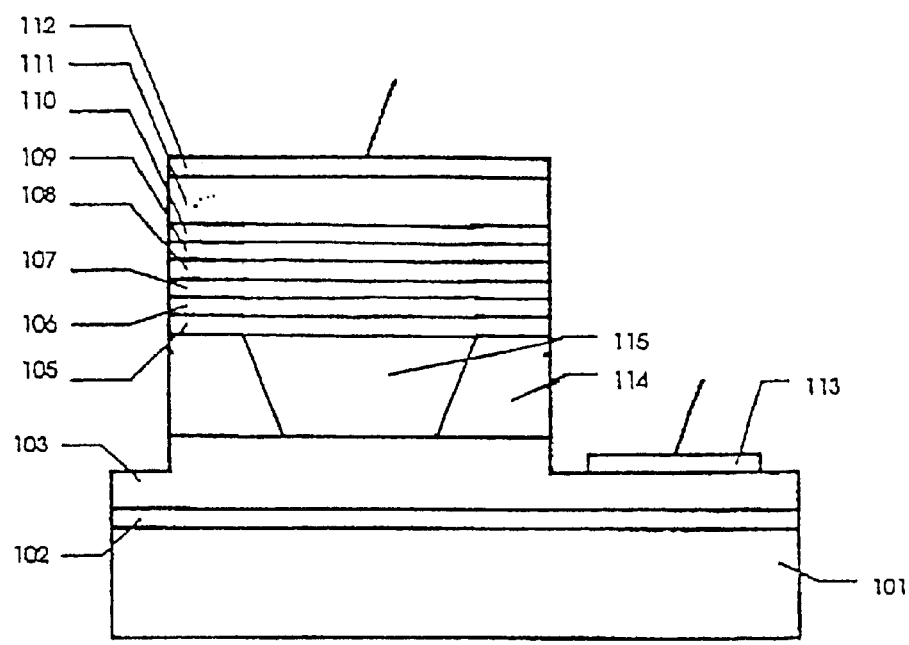
FIG. 5 is a fragmentary cross sectional elevation view illustrative of a novel gallium nitride based compound semiconductor laser having a current block layer structure for a current confinement in a second embodiment according to the present invention.
Figure 6:
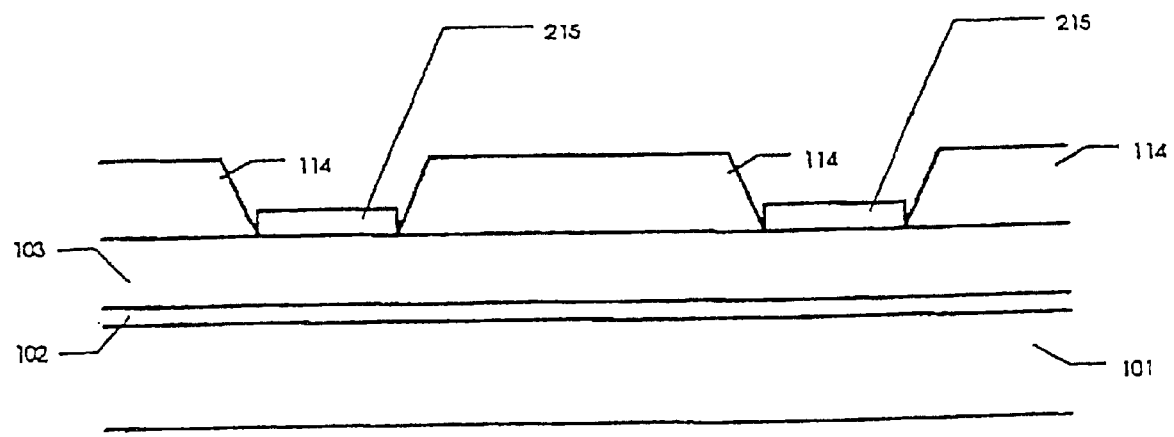
FIG. 6 is a fragmentary cross sectional elevation view illustrative of a novel gallium nitride based compound semiconductor laser in a selective growth process by a metal organic chemical vapor deposition method involved in a fabrication method thereof.

A second embodiment according to the present invention will be described with reference to FIGS. 5 and 6. FIG. 5 is a fragmentary cross sectional elevation view illustrative of a novel gallium nitride based compound semiconductor laser having a current block layer structure for a current confinement in a second embodiment according to the present invention. FIG. 6 is a fragmentary cross sectional elevation view illustrative of a novel gallium nitride based compound semiconductor laser in a selective growth process by a metal organic chemical vapor deposition method involved in a fabrication method thereof.

The novel gallium nitride based compound semiconductor laser is formed on a (0001)-face sapphire substrate 101. All of compound semiconductor layers in the novel gallium nitride based compound semiconductor laser have hexagonal crystal structures. The structure of the novel gallium nitride based compound semiconductor laser is as follows. A 300 Å-thick undoped GaN buffer layer 102 is provided on a (0001)-face sapphire substrate 101. The 300 Å-thick undoped GaN buffer layer 102 has a hexagonal crystal structure. A 3 μm-thick n-type GaN contact layer 103 doped with Si is provided on an entire surface of the 300 Å-thick undoped GaN buffer layer 102. The 3 μm-thick n-type GaN contact layer 103 has a hexagonal crystal structure. The 3 μm-thick n-type GaN contact layer 103 has a ridged portion and recess portions. A top surface of the ridged portion of the 3 μm-thick n-type GaN contact layer 103 is a flat surface. Upper surfaces of the recess portions of the 3 μm-thick n-type GaN contact layer 103 are also flat surfaces. Further, 0.5 μm-thick p-type GaN current block layers 114 doped with Mg are selectively provided on the top flat surface of the ridged portion of the 3 μm-thick n-type GaN contact layer 103. The 0.5 μm-thick p-type GaN current block layers 114 also have the hexagonal crystal structure. As will be described later, the 0.5 μm-thick p-type GaN current block layers 114 are formed by a selective growth of a metal organic chemical vapor deposition method using dielectric stripe masks, for which reason the 0.5 μm-thick p-type GaN current block layers 114 have highly flat and sloped inside walls. It is important that the 0.5 μm-thick p-type GaN current block layers 114 having the hexagonal crystal structure are selectively grown by the metal organic chemical vapor deposition method using dielectric stripe masks on the 3 μm-thick n-type GaN contact layer 103 having the hexagonal crystal structure. This results in the formation of the highly flat and sloped inside walls of the 0.5 μm-thick p-type GaN current block layers 114. The highly flat and sloped inside walls of the 0.5 μm-thick p-type GaN current block layers 114 cause current confinement as will be described later. A 0.5 μm-thick n-type GaN cladding layer 115 doped with Si is then selectively provided which extends on the above highly flat sloped inside walls of the 0.5 μm-thick p-type GaN current block layers 114 as well as on an uncovered part of a top surface of the 3 μm-thick n-type GaN contact layer 103 whilst the 0.5 μm-thick n-type GaN cladding layer 115 does not extend over the top surfaces of the 0.5 μm-thick p-type GaN current block layers 114 so that the top surface of the 0.5 μm-thick n-type GaN cladding layer 115 has the same level as the top surfaces of the 0.5 μm-thick p-type GaN current block layers 114, whereby a flat top surface is formed. The 0.5 μm-thick n-type GaN cladding layer 115 has the hexagonal crystal structure. A 0.4 μm-thick n-type $Al_{0.07}Ga_{0.93}N$ cladding layer 105 doped with Si is provided on the flat and leveled top surfaces of the 0.5 μm-thick n-type GaN cladding layer 115 and the 0.5 μm-thick p-type GaN current block layers 114. The 0.4 μm-thick n-type $Al_{0.07}Ga_{0.93}N$ cladding layer 105 is flat layer or has no difference in level. The 0.4 μm-thick n-type $Al_{0.07}Ga_{0.93}N$ cladding layer 105 has the hexagonal crystal structure. A 0.1 μm-thick n-type GaN optical guide layer 106 doped with Si is provided on the 0.4 μm-thick n-type $Al_{0.07}Ga_{0.93}N$ cladding layer 105. The 0.1 μm-thick n-type GaN optical guide layer 106 has the hexagonal crystal structure. A multiple quantum well active layer 107 is provided on the 0.1 μm-thick p-type GaN optical guide layer 106. The multiple quantum well active layer 107 comprises 7 periods of alternating 25 Å-thick undoped $In_{0.2}Ga_{0.8}N$ quantum well layers and 50 Å-thick undoped $In_{0.05}Ga_{0.95}N$ barrier layers. The 25 Å-thick undoped $In_{0.2}Ga_{0.8}N$ quantum well layers have the hexagonal crystal structure. The 50 Å-thick undoped $In_{0.05}Ga_{0.95}N$ barrier layers have the hexagonal crystal structure. A 200 Å-thick p-type $Al_{0.2}Ga_{0.8}N$ layer 108 doped with Mg is provided on the multiple quantum well active layer 107. The 200 Å-thick p-type $Al_{0.2}Ga_{0.8}N$ layer 108 has the hexagonal crystal structure. A 0.1 μm-thick p-type GaN optical guide layer 109 doped with Mg is provided on the 200 Å-thick p-type $Al_{0.2}Ga_{0.8}N$ layer 108. The 0.1 μm-thick p-type GaN optical guide layer 109 has the hexagonal crystal structure. A 0.4 μm-thick p-type $Al_{0.07}Ga_{0.93}N$ cladding layer 110 doped with Mg is provided on the 0.1 μm-thick p-type GaN optical guide layer 109. The 0.4 μm-thick p-type $Al_{0.07}Ga_{0.93}N$ cladding layer 110 has the hexagonal crystal structure. There are no differences in level of the 0.4 μm-thick n-type $Al_{0.07}Ga_{0.93}N$ cladding layer 105, the 0.1 μm-thick n-type GaN optical guide layer 106, the multiple quantum well active layer 107, the 200 Å-thick p-type $Al_{0.2}Ga_{0.8}N$ layer 108, the 0.1 μm-thick p-type GaN optical guide layer 109 and the 0.4 μm-thick p-type $Al_{0.07}Ga_{0.93}N$ cladding layer 110. A 0.2 μm-thick p-type GaN contact layer 111 doped with Mg is provided on the 0.4 μm-thick p-type $Al_{0.07}Ga_{0.93}N$ cladding layer 110. A top surface of the 0.2 μm-thick p-type GaN contact layer 111 is flat. The 0.2 μm-thick p-type GaN contact layer 111 has the hexagonal crystal structure. A p-electrode 112 is provided on the top flat surface of the 0.2 μm-thick p-type GaN contact layer 111. The p-electrode 112 comprises a nickel layer laminated on the top flat surface of the 0.2 μm-thick p-type GaN contact layer 111 and a gold layer laminated on the nickel layer. An n-electrode 113 is provided on the recessed surface of the 3 μm-thick n-type GaN contact layer 103. The n-electrode 113 comprises a titanium layer laminated on the 3 μm-thick n-type GaN contact layer 103 and an aluminum layer laminated on the titanium layer.

As described above, since the 0.5 μm-thick p-type GaN current block layers 114 have an opposite conductivity type to that of the 3 μm-thick n-type GaN contact layer 103 and the 0.5 μm-thick n-type GaN cladding layer 115 as well as the 0.4 μm-thick n-type $Al_{0.07}Ga_{0.93}N$ cladding layer 105, then the 0.5 μm-thick p-type GaN current block layers 114 are capable of blocking or guiding a current for current confinement. This current confinement allows a reduction in threshold current of the laser diode.

The above laser diode is formed as follows. The 300 Å-thick undoped GaN buffer layer 102 is grown by a metal organic chemical vapor deposition method at a low temperature on the flat (0001)-face sapphire substrate 101 so that the 300 Å-thick undoped GaN buffer layer 102 has a hexagonal crystal structure. The 3 μm-thick n-type GaN contact layer 103 doped with Si is grown by a metal organic chemical vapor deposition method on an entire surface of the 300 Å-thick undoped GaN buffer layer 102 so that the 3 μm-thick n-type GaN contact layer 103 has a hexagonal crystal structure. Silicon oxide stripe masks 215 having a width of 1 micrometer are arranged in a [11–20] direction of the hexagonal crystal structure of the 3 μm-thick n-type GaN contact layer 103. The silicon oxide stripe masks 215 define stripe-shaped openings. The 0.5 μm-thick p-type GaN current block layers 114 doped with Mg are selectively grown on the top flat surface of the ridged portion of the 3 μm-thick n-type GaN contact layer 103 by the metal organic chemical vapor deposition method using the silicon oxide stripe masks 215. Namely, the 0.5 μm-thick p-type GaN current block layers 114 are selectively grown only on the stripe-shaped openings defined by silicon oxide stripe masks 215. The 0.5 μm-thick p-type GaN current block layers 114 also have the hexagonal crystal structure. Since the 0.5 μm-thick p-type GaN current block layers 114 are grown by a selective growth of the metal organic chemical vapor deposition method using dielectric stripe masks, the 0.5 μm-thick p-type GaN current block layers 114 have highly flat and sloped inside walls. It is important that the 0.5 μm-thick p-type GaN current block layers 114 having the hexagonal crystal structure are selectively grown by the metal organic chemical vapor deposition method using dielectric stripe masks on the 3 μm-thick n-type GaN contact layer 103 having the hexagonal crystal structure. This results in the formation of the highly flat and sloped inside walls of the 0.5 μm-thick p-type GaN current block layers 114. The highly flat and sloped inside walls of the 0.5 μm-thick p-type GaN current block layers 114 cause current confinement. The used silicon oxide stripe masks 215 are removed by a florin acid solution. Other silicon oxide stripe masks not illustrated are then provided on the top surfaces of the 0.5 μm-thick p-type GaN current block layers 114. The 0.1 μm-thick n-type GaN cladding layer 115 doped with Si is then grown by the metal organic chemical vapor deposition using the other silicon oxide stripe masks so that the 0.5 μm-thick n-type GaN cladding layer 115 extends on the above highly flat sloped inside walls of the 0.5 μm-thick p-type GaN current block layers 114 as well as on an uncovered part of a top surface of the 3 μm-thick n-type GaN contact layer 103. However, the 0.5 μm-thick n-type GaN cladding layer 115 does not extend over the top surfaces of the 0.5 μm-thick p-type GaN current block layers 114. Namely, the top surface of the 0.5 μm-thick n-type GaN cladding layer 115 has the same level as the top surfaces of the 0.5 μm-thick p-type GaN current block layers 114. The 0.5 μm-thick n-type GaN cladding layer 115 also has the hexagonal crystal structure. The used other silicon oxide stripe masks are removed. The 0.4 $\mu$m-thick n-type $Al_{0.07}Ga_{0.93}N$ cladding layer 105 doped with Si is grown by the metal organic chemical vapor deposition on the 0.1 $\mu$m-thick n-type GaN cladding layer 115 so that the 0.4 $\mu$m-thick n-type $Al_{0.07}Ga_{0.93}N$ cladding layer 105 has the hexagonal crystal structure. The 0.1 $\mu$m-thick n-type GaN optical guide layer 106 doped with Si is grown by the metal organic chemical vapor deposition on the 0.4 $\mu$m-thick n-type $Al_{0.07}Ga_{0.93}N$ cladding layer 105 so that the 0.1 $\mu$m-thick n-type GaN optical guide layer 106 has the hexagonal crystal structure. The multiple quantum well active layer 107 is grown by the metal organic chemical vapor deposition on the 0.1 $\mu$m-thick n-type GaN optical guide layer 106, wherein the multiple quantum well active layer 107 comprises 7 periods of alternating 25 Å-thick undoped $In_{0.2}Ga_{0.8}N$ quantum well layers and 50 Å-thick undoped $In_{0.05}Ga_{0.95}N$ barrier layers. The 25 Å-thick undoped $In_{0.2}Ga_{0.8}N$ quantum well layers and the 50 Å-thick undoped $In_{0.05}Ga_{0.95}N$ barrier layers have the hexagonal crystal structure. The 200 Å-thick p-type $Al_{0.2}Ga_{0.8}N$ layer 108 doped with Mg is grown by the metal organic chemical vapor deposition on the multiple quantum well active layer 107 so that the 200 Å-thick p-type $Al_{0.2}Ga_{0.8}N$ layer 108 has the hexagonal crystal structure. The 200 Å-thick p-type $Al_{0.2}Ga_{0.8}N$ layer 108 is capable of preventing dissociation of indium from the multiple quantum well active layer 107. The 0.1 $\mu$m-thick p-type GaN optical guide layer 109 doped with Mg is grown by the metal organic chemical vapor deposition on the 200 Å-thick p-type $Al_{0.2}Ga_{0.8}N$ layer 108 so that the 0.1 $\mu$m-thick p-type GaN optical guide layer 109 has the hexagonal crystal structure. The 0.4 $\mu$m-thick p-type $Al_{0.07}Ga_{0.93}N$ cladding layer 110 doped with Mg is grown by the metal organic chemical vapor deposition on the 0.1 $\mu$m-thick p-type GaN optical guide layer 109 so that the 0.4 $\mu$m-thick p-type $Al_{0.07}Ga_{0.93}N$ cladding layer 110 has the hexagonal crystal structure. The 0.2 $\mu$m-thick p-type GaN contact layer 111 doped with Mg is grown by the metal organic chemical vapor deposition on the 0.4 $\mu$m-thick p-type $Al_{0.07}Ga_{0.93}N$ cladding layer 110 so that the 0.2 $\mu$m-thick p-type GaN contact layer 111 has the hexagonal crystal structure. The nickel layer is formed on the top flat surface of the 0.2 $\mu$m-thick p-type GaN contact layer 111 and a gold layer is then formed on the nickel layer thereby forming the p-electrode 112 A titanium layer is formed on the 3 $\mu$m-thick n-type GaN contact layer 103 and an aluminum layer is then formed on the titanium layer.

Since the 0.5 $\mu$m-thick p-type GaN current block layers 114 have an opposite conductivity type to that of the 3 $\mu$m-thick n-type GaN contact layer 103 and the 0.5 $\mu$m-thick n-type GaN cladding layer 115 as well as the 0.4 $\mu$m-thick n-type $Al_{0.07}Ga_{0.93}N$ cladding layer 105, then the 0.5 $\mu$m-thick p-type GaN current block layers 114 are capable of blocking or guiding a current for current confinement. This current confinement allows a reduction in threshold current of the laser diode.

Since, further, the p-electrode 112 has a large contact area with the 0.2 $\mu$m-thick p-type GaN contact layer 111, a contact resistance between the p-electrode 112 and the 0.2 $\mu$m-thick p-type GaN contact layer 111 is small.

Furthermore, the above current confinement structure can be formed without use of the dry etching process.

Moreover, the multiple quantum well active layer 107 is formed on the flat surface. This results in no possibility of compositional modification or no variation in composition over position of the active layer.

Since the gallium nitride based compound semiconductor layers having the hexagonal crystal structure are selectively formed on the (0001)-face of the gallium nitride layer, then the gallium nitride based compound semiconductor layers are almost not grown in the [1–100] direction.

Namely, the p-type gallium nitride current block layers 114 having the hexagonal structure are selectively grown on the (0001)-face of the n-type gallium nitride layer 103 having the hexagonal crystal structure by use of the dielectric stripe masks arranged in a longitudinal direction along the [11–20] direction so that no extending portion over the dielectric stripe masks is formed.

In the above gallium nitride based compound semiconductor laser diode, an optical waveguide is formed in a direction along the [11–20] direction of the crystal structure. It is difficult to cleave the semiconductor wafer in the [11–20] direction. This means it difficult to form the reflective faces of resonator in the laser diode by the cleaving method. For this reason, it is necessary to form the reflective faces of resonator in the laser diode by other method such as dry etching.

As a modification, the optical waveguide may be formed in a direction tilted from the [11–20] direction of the crystal structure by an angle in the range of ±5 degrees. Even if the optical waveguide is formed in a direction tilted from the [11–20] direction of the crystal structure by an angle over the range of ±5 degrees, then there is no problem unless the semiconductor layer is allowed to be selectively grown in the [11–20] direction. In the later case, however, it is necessary that the dielectric strip masks are almost the same in thickness as the current block layers.

Whereas in the above embodiment the semiconductor layers having the hexagonal crystal structure are grown on the (0001)-face of the sapphire substrate, it is also possible to grow the semiconductor layers having the hexagonal crystal structure on the (11–20)-face of the sapphire substrate.

Further, in place of the (0001)-face sapphire substrate and the (11–20)-face sapphire substrate, silicon oxide substrates with the (0001)-face or the (11–20)-face are available. Furthermore, $MgAl_2O_4$ substrates with the (0001)-face or the (11–20)-face are also available. Gallium nitride substrates with the (0001)-face or the (11–20)-face are still further available. The sapphire substrate, silicon oxide substrate, $MgAl_2O_4$ substrate, and gallium nitride substrate having other faces than the (0001)-face or the (11–20)-face are also available.

The above present invention can be applied not only to the gallium nitride based laser diode as illustrated in the drawings but also other gallium nitride based laser diodes which are different in thickness of layer, composition of layer, doping concentration of layer, material of electrode, martial of dielectric stripe masks, depth of dry etching, and width of stripe of the dielectric stripe masks.

Although in the above embodiment, the individual semiconductor layers have surfaces of the (0001)-face, the surfaces of the individual semiconductor layers may be tilted from the (0001)-face by an angle in the range of ±5 degrees.

Third Embodiment

Figure 7:
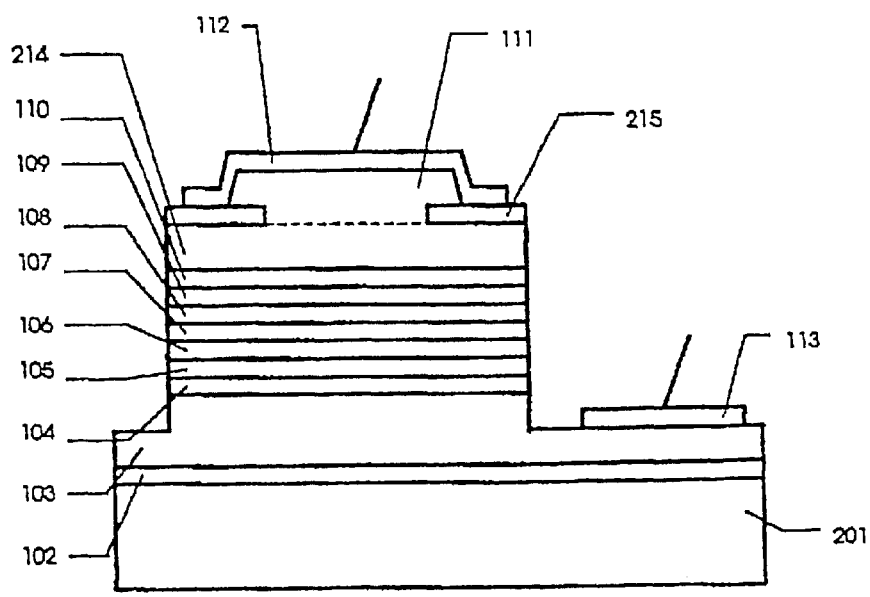
FIG. 7 is a fragmentary cross sectional elevation view illustrative of a novel gallium nitride based compound semiconductor laser having a current block layer structure for a current confinement in a third embodiment according to the present invention.
Figure 8:
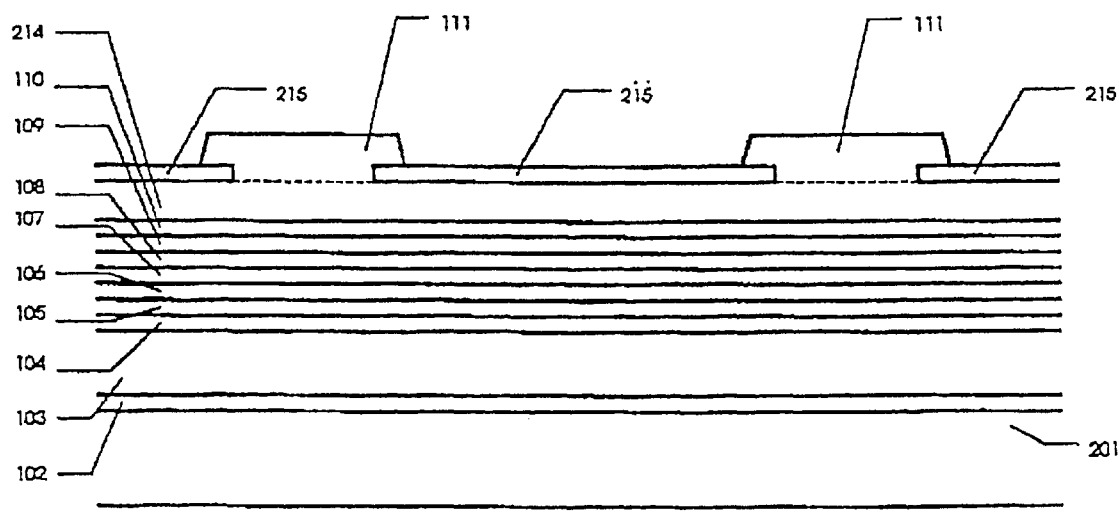
FIG. 8 is a fragmentary cross sectional elevation view illustrative of a novel gallium nitride based compound semiconductor laser in a selective growth process by a metal organic chemical vapor deposition method involved in a fabrication method thereof.

A third embodiment according to the present invention will be described with reference to FIGS. 7 and 8. FIG. 7 is a fragmentary cross sectional elevation view illustrative of a novel gallium nitride based compound semiconductor laser having a current block layer structure for a current confinement in a third embodiment according to the present invention. FIG. 8 is a fragmentary cross sectional elevation view illustrative of a novel gallium nitride based compound semiconductor laser in a selective growth process by a metal organic chemical vapor deposition method involved in a fabrication method thereof.

The novel gallium nitride based compound semiconductor laser is formed on a (11–20)-face sapphire substrate 201. All of compound semiconductor layers in the novel gallium nitride based compound semiconductor laser have hexagonal crystal structures. The structure of the novel gallium nitride based compound semiconductor laser is as follows. A 300 Å-thick undoped GaN buffer layer 102 is provided on a (11–20)-face sapphire substrate 201. The 300 Å-thick undoped GaN buffer layer 102 has a hexagonal crystal structure. A 3 μm-thick n-type GaN contact layer 103 doped with Si is provided on an entire surface of the 300 Å-thick undoped GaN buffer layer 102. The 3 μm-thick n-type GaN contact layer 103 has a hexagonal crystal structure. The 3 μm-thick n-type GaN contact layer 103 has a ridged portion and recess portions. A top surface of the ridged portion of the 3 μm-thick n-type GaN contact layer 103 is a flat surface. Upper surfaces of the recess portions of the 3 μm-thick n-type GaN contact layer 103 are also flat surfaces. A 0.1 μm-thick n-type $In_{0.05}Ga_{0.95}N$ layer 104 doped with Si is provided on the top flat surface of the ridged portion of the 3 μm-thick n-type GaN contact layer 103. The 0.1 μm-thick n-type $In_{0.05}Ga_{0.95}N$ layer 104 is capable of preventing crack in the compound semiconductor. A 0.4 μm-thick n-type $Al_{0.07}Ga_{0.93}N$ cladding layer 105 doped with Si is provided on the 0.1 μm-thick n-type $In_{0.05}Ga_{0.95}N$ layer 104. The 0.4 μm-thick n-type $Al_{0.07}Ga_{0.93}N$ cladding layer 105 has the hexagonal crystal structure. A 0.1 μm-thick n-type GaN optical guide layer 106 doped with Si is provided on the 0.4 μm-thick n-type $Al_{0.07}Ga_{0.93}N$ cladding layer 105. The 0.1 μm-thick n-type GaN optical guide layer 106 has the hexagonal crystal structure. A multiple quantum well active layer 107 is provided on the 0.1 μm-thick n-type GaN optical guide layer 106. The multiple quantum well active layer 107 comprises 7 periods of alternating 25 Å-thick undoped $In_{0.2}Ga_{0.8}N$ quantum well layers and 50 Å-thick undoped $In_{0.05}Ga_{0.95}N$ barrier layers. The 25 Å-thick undoped $In_{0.2}Ga_{0.8}N$ quantum well layers have the hexagonal crystal structure. The 50 Å-thick undoped $In_{0.05}Ga_{0.95}N$ barrier layers have the hexagonal crystal structure. A 200 Å-thick p-type $Al_{0.2}Ga_{0.8}N$ layer 108 doped with Mg is provided on the multiple quantum well active layer 107. The 200 Å-thick p-type $Al_{0.2}Ga_{0.8}N$ layer 108 has the hexagonal crystal structure. A 0.1 μm-thick p-type GaN optical guide layer 109 doped with Mg is provided on the 200 Å-thick p-type $Al_{0.2}Ga_{0.8}N$ layer 108. The 0.1 μm-thick p-type GaN optical guide layer 109 has the hexagonal crystal structure. A 0.4 μm-thick p-type $Al_{0.07}Ga_{0.93}N$ cladding layer 110 doped with Mg is provided on the 0.1 μm-thick p-type GaN optical guide layer 109. The 0.4 μm-thick p-type $Al_{0.07}Ga_{0.93}N$ cladding layer 110 has the hexagonal crystal structure. A 0.2 μm-thick p-type GaN layer 214 doped with Mg is provided on the 0.4 μm-thick p-type $Al_{0.07}Ga_{0.93}N$ cladding layer 110. The 0.2 μm-thick p-type GaN layer 214 has the hexagonal crystal structure. Further, 2000 Å-thick silicon oxide stripe masks 215 are provided so that a longitudinal direction of the 2000 Å-thick silicon oxide stripe masks 215 is parallel to the [1–100] direction of the hexagonal crystal structure. The 2000 Å-thick silicon oxide stripe masks 215 defines a stripe-shaped opening with a width of 5 μm. A 0.3 μm-thick p-type GaN contact layer 111 doped with Mg is selectively provided on the stripe-shaped opening of the 2000 Å-thick silicon oxide stripe masks 215 over the 0.2 μm-thick p-type GaN layer 214 and also on parts adjacent to the stripe-shaped opening of the 2000 Å-thick silicon oxide stripe masks 215. Namely, the 0.3 μm-thick p-type GaN contact layer 111 is selectively grown by use of the 2000 Å-thick silicon oxide stripe masks 215 so that the 0.3 μm-thick p-type GaN contact layer 111 has a ridge-shape in cross sectional view and also has sloped and highly flat side walls. The 0.3 μm-thick p-type GaN contact layer 111 has the hexagonal crystal structure. A p-electrode 112 is provided which extends on the top surface and the highly flat side walls of the 0.3 μm-thick p-type GaN contact layer 111 as well as over parts of the 2000 Å-thick silicon oxide stripe masks 215. The p-electrode 112 comprises a nickel layer laminated on the top surface and the highly flat side walls of the 0.3 μm-thick p-type GaN contact layer 111 and a gold layer laminated on the nickel layer. An n-electrode 113 is provided on the recessed surface of the 3 μm-thick n-type GaN contact layer 103. The n-electrode 113 comprises a titanium layer laminated on the 3 μm-thick n-type GaN contact layer 103 and an aluminum layer laminated on the titanium layer.

In this embodiment, the 2000 Å-thick silicon oxide stripe masks 215 and the ridge-shaped 0.3 μm-thick p-type GaN contact layer 111 serve for current confinement. This current confinement allows a reduction in threshold current of the laser diode.

The above laser diode is formed as follows. The 300 Å-thick undoped GaN buffer layer 102 is grown by a metal organic chemical vapor deposition method at a low temperature on the flat (11–20)-face sapphire substrate 201 so that the 300 Å-thick undoped GaN buffer layer 102 has a hexagonal crystal structure. The 3 μm-thick n-type GaN contact layer 103 doped with Si is grown by a metal organic chemical vapor deposition method on an entire surface of the 300 Å-thick undoped GaN buffer layer 102 so that the 3 μm-thick n-type GaN contact layer 103 has a hexagonal crystal structure. The 0.1 μm-thick n-type $In_{0.05}Ga_{0.95}N$ layer 104 doped with Si is grown by the metal organic chemical vapor deposition on the top surface of the ridged portion of the 3 μm-thick n-type GaN contact layer 103 so that the 0.1 μm-thick n-type $In_{0.05}Ga_{0.95}N$ layer 104 has a hexagonal crystal structure. The 0.4 μm-thick n-type $Al_{0.07}Ga_{0.93}N$ cladding layer 105 doped with Si is grown by the metal organic chemical vapor deposition on the 0.1 μm-thick n-type $In_{0.05}Ga_{0.95}N$ layer 104 so that the 0.4 μm-thick n-type $Al_{0.07}Ga_{0.93}N$ cladding layer 105 has the hexagonal crystal structure. The 0.1 μm-thick n-type GaN optical guide layer 106 doped with Si is grown by the metal organic chemical vapor deposition on the 0.4 μm-thick n-type $Al_{0.07}Ga_{0.93}N$ cladding layer 105 so that the 0.1 μm-thick n-type GaN optical guide layer 106 has the hexagonal crystal structure. The multiple quantum well active layer 107 is grown by the metal organic chemical vapor deposition on the 0.1 μm-thick n-type GaN optical guide layer 106, wherein the multiple quantum well active layer 107 comprises 7 periods of alternating 25 Å-thick undoped $In_{0.2}Ga_{0.8}N$ quantum well layers and 50 Å-thick undoped $In_{0.05}Ga_{0.95}N$ barrier layers. The 25 Å-thick undoped $In_{0.2}Ga_{0.8}N$ quantum well layers and the 50 Å-thick undoped $In_{0.05}Ga_{0.95}N$ barrier layers have the hexagonal crystal structure. The 200 Å-thick p-type $Al_{0.2}Ga_{0.8}N$ layer 108 doped with Mg is grown by the metal organic chemical vapor deposition on the multiple quantum well active layer 107 so that the 200 Å-thick p-type $Al_{0.2}Ga_{0.8}N$ layer 108 has the hexagonal crystal structure. The 200 Å-thick p-type $Al_{0.2}Ga_{0.8}N$ layer 108 is capable of preventing dissociation of indium from the multiple quantum well active layer 107.

The 0.1 μm-thick p-type GaN optical guide layer 109 doped with Mg is grown by the metal organic chemical vapor deposition on the 200 Å-thick p-type $Al_{0.2}Ga_{0.8}N$ layer 108 so that the 0.1 μm-thick p-type GaN optical guide layer 109 has the hexagonal crystal structure. The 0.4 μm-thick p-type $Al_{0.07}Ga_{0.93}N$ cladding layer 110 doped with Mg is grown by the metal organic chemical vapor deposition on the 0.1 μm-thick p-type GaN optical guide layer 109 so that the 0.4 μm-thick p-type $Al_{0.07}Ga_{0.93}N$ cladding layer 110 has the hexagonal crystal structure. The 0.2 μm-thick p-type GaN layer 214 is grown by the metal organic chemical vapor deposition on the 0.4 μm-thick p-type $Al_{0.07}Ga_{0.93}N$ cladding layer 110 so that the 0.2 μm-thick p-type GaN layer 214 has the hexagonal crystal structure. Further, 2000 Å-thick silicon oxide stripe masks 215 are arranged on the 0.2 μm-thick p-type GaN layer 214 so that a longitudinal direction of the 2000 Å-thick silicon oxide stripe masks 215 is parallel to the [1–100] direction of the hexagonal crystal structure. The 2000 Å-thick silicon oxide stripe masks 215 defines a stripe-shaped opening with a width of 5 μm. A 0.3 μm-thick p-type GaN contact layer 111 doped with Mg is selectively grown by the metal organic chemical vapor deposition using the 2000 Å-thick silicon oxide stripe masks 215 on the stripe-shaped opening of the 2000 Å-thick silicon oxide stripe masks 215 over the 0.2 μm-thick p-type GaN layer 214 and also on parts adjacent to the stripe-shaped opening of the 2000 Å-thick silicon oxide stripe masks 215. The 0.3 μm-thick p-type GaN contact layer 111 has a ridge-shape in cross sectional view and also has sloped and highly flat side walls. The 0.3 μm-thick p-type GaN contact layer 111 has the hexagonal crystal structure. The nickel layer is formed on the top surface and the sloped and highly flat side walls of the 0.3 μm-thick p-type GaN contact layer 111 as well as parts of the 2000 Å-thick silicon oxide stripe masks 215. A gold layer is then formed on the nickel layer thereby forming the p-electrode 112. A titanium layer is formed on the 3 μm-thick n-type GaN contact layer 103 and an aluminum layer is then formed on the titanium layer.

Since the 2000 Å-thick silicon oxide stripe masks 215 and the ridge-shaped 0.3 μm-thick p-type GaN contact layer 111 serve for current confinement. This current confinement allows a reduction in threshold current of the laser diode.

Since, further, the p-electrode 112 has a large contact area with the 0.3 μm-thick p-type GaN contact layer 111, a contact resistance between the p-electrode 112 and the 0.3 μm-thick p-type GaN contact layer 111 is small.

Furthermore, the above current confinement structure can be formed without use of the dry etching process.

Moreover, the multiple quantum well active layer 107 is formed on the flat surface. This results in no possibility of compositional modification or no variation in composition over position of the active layer.

Since the gallium nitride based compound semiconductor layers having the hexagonal crystal structure are selectively formed on the (0001)-face of the gallium nitride layer, then a growth rate of gallium nitride in the [11–20] direction is almost the same as that in the [0001] direction.

Namely, the p-type gallium nitride contact layer 111 having the hexagonal structure are selectively grown on the (0001)-face of the p-type gallium nitride layer 214 having the hexagonal crystal structure by use of the dielectric stripe masks arranged in a longitudinal direction along the [1–100] direction so that the p-type gallium nitride contact layer 111 has extending portions over the dielectric stripe masks. This leads to a large contact area between the p-type gallium nitride contact layer 111 and the p-electrode 112 thereby reduction in contact resistance between the p-type gallium nitride contact layer 111 and the p-electrode 112.

In the above gallium nitride based compound semiconductor laser diode, an optical waveguide is formed in a direction along the [1–100] direction of the crystal structure. It is possible to cleave the semiconductor wafer in the [1–100] direction. This means it possible to form the reflective faces of resonator in the laser diode by the cleaving method.

Moreover, the p-type gallium nitride contact layer 111 are positioned between the 2000 Å-thick silicon oxide stripe masks 215 so that an optical control in the transverse mode can be made.

As a modification, the optical waveguide may be formed in a direction tilted from the [1–100] direction of the crystal structure by an angle in the range of ±5 degrees. Even if the optical waveguide is formed in a direction tilted from the [1–100] direction of the crystal structure by an angle over the range of ±5 degrees, then there is no further problem to a reduction in contact area between the p-electrode and the contact layer.

Whereas in the above embodiment the semiconductor layers having the hexagonal crystal structure are grown on the (11–20)-face of the sapphire substrate, it is also possible to grow the semiconductor layers having the hexagonal crystal structure on the (0001)-face of the sapphire substrate.

Further, in place of the (0001)-face sapphire substrate and the (11–20)-face sapphire substrate, silicon oxide substrates with the (0001)-face or the (11–20)-face are available. Furthermore, $MgAl_2O_4$ substrates with the (0001)-face or the (11–20)-face are also available. Gallium nitride substrates with the (0001)-face or the (11–20)-face are still further available. The sapphire substrate, silicon oxide substrate, $MgAl_2O_4$ substrate, and gallium nitride substrate having other faces than the (0001)-face or the (11–20)-face are also available.

The above present invention can be applied not only to the gallium nitride based laser diode as illustrated in the drawings but also other gallium nitride based laser diodes which are different in thickness of layer, composition of layer, doping concentration of layer, material of electrode, martial of dielectric stripe masks, depth of dry etching, and width of stripe of the dielectric stripe masks.

Although in the above embodiment, the individual semiconductor layers have surfaces of the (0001)-face, the surfaces of the individual semiconductor layers may be tilted from the (0001)-face by an angle in the range of ±5 degrees.

Fourth Embodiment

Figure 9:
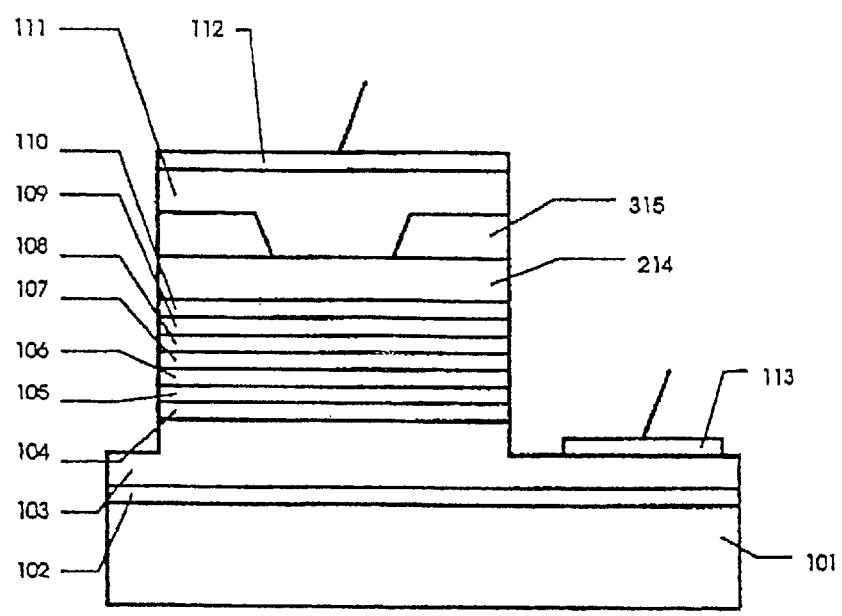
FIG. 9 is a fragmentary cross sectional elevation view illustrative of a novel gallium nitride based compound semiconductor laser having a current block layer structure for a current confinement in a fourth embodiment according to the present invention.
Figure 10:
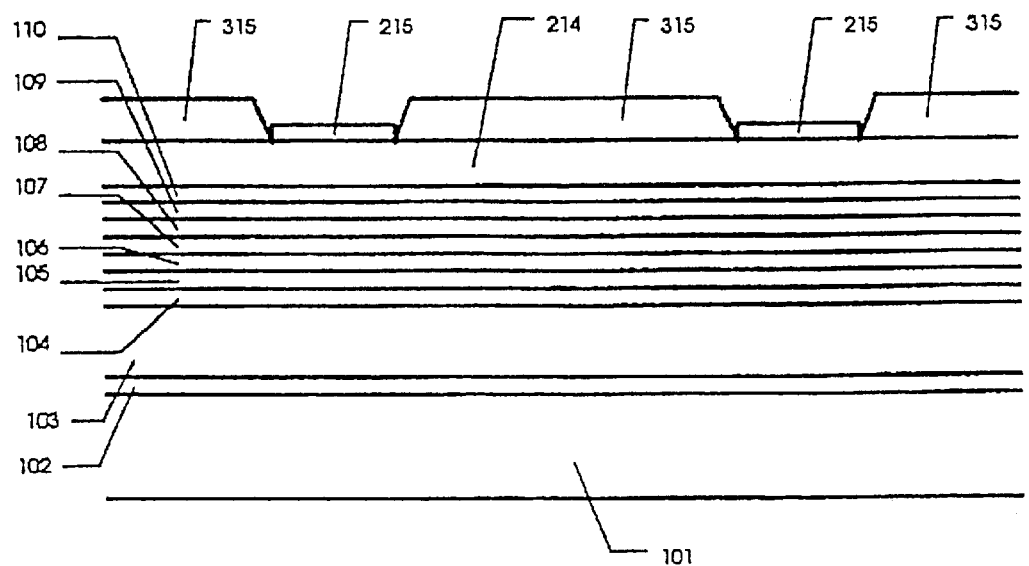
FIG. 10 is a fragmentary cross sectional elevation view illustrative of a novel gallium nitride based compound semiconductor laser in a selective growth process by a metal organic chemical vapor deposition method involved in a fabrication method thereof.

A fourth embodiment according to the present invention will be described with reference to FIGS. 9 and 10. FIG. 9 is a fragmentary cross sectional elevation view illustrative of a novel gallium nitride based compound semiconductor laser having a current block layer structure for a current confinement in a fourth embodiment according to the present invention. FIG. 10 is a fragmentary cross sectional elevation view illustrative of a novel gallium nitride based compound semiconductor laser in a selective growth process by a metal organic chemical vapor deposition method involved in a fabrication method thereof.

The novel gallium nitride based compound semiconductor laser is formed on a (0001)-face sapphire substrate 101. All of compound semiconductor layers in the novel gallium nitride based compound semiconductor laser have hexagonal crystal structures. The structure of the novel gallium nitride based compound semiconductor laser is as follows. A 300 Å-thick undoped GaN buffer layer 102 is provided on a (0001)-face sapphire substrate 101. The 300 Å-thick undoped GaN buffer layer 102 has a hexagonal crystal structure. A 3 μm-thick n-type GaN contact layer 103 doped with Si is provided on an entire surface of the 300 Å-thick undoped GaN buffer layer 102. The 3 μm-thick n-type GaN contact layer 103 has a hexagonal crystal structure. The 3 μm-thick n-type GaN contact layer 103 has a ridged portion and recess portions. A top surface of the ridged portion of the 3 μm-thick n-type GaN contact layer 103 is a flat surface. Upper surfaces of the recess portions of the 3 μm-thick n-type GaN contact layer 103 are also flat surfaces. A 0.1 μm-thick n-type $In_{0.05}Ga_{0.95}N$ layer 104 doped with Si is provided on the top flat surface of the ridged portion of the 3 μm-thick n-type GaN contact layer 103. The 0.1 μm-thick n-type $In_{0.05}Ga_{0.95}N$ layer 104 is capable of preventing crack in the compound semiconductor. A 0.4 μm-thick n-type $Al_{0.07}Ga_{0.93}N$ cladding layer 105 doped with Si is provided on the 0.1 μm-thick n-type $In_{0.05}Ga_{0.95}N$ layer 104. The 0.4 μm-thick n-type $Al_{0.07}Ga_{0.93}N$ cladding layer 105 has the hexagonal crystal structure. A 0.1 μm-thick n-type GaN optical guide layer 106 doped with Si is provided on the 0.4 μm-thick n-type $Al_{0.07}Ga_{0.93}N$ cladding layer 105. The 0.1 μm-thick n-type GaN optical guide layer 106 has the hexagonal crystal structure. A multiple quantum well active layer 107 is provided on the 0.1 μm-thick n-type GaN optical guide layer 106. The multiple quantum well active layer 107 comprises 7 periods of alternating 25 Å-thick undoped $In_{0.2}Ga_{0.8}N$ quantum well layers and 50 Å-thick undoped $In_{0.05}Ga_{0.95}N$ barrier layers. The 25 Å-thick undoped $In_{0.2}Ga_{0.8}N$ quantum well layers have the hexagonal crystal structure. The 50 Å-thick undoped $In_{0.05}Ga_{0.95}N$ barrier layers have the hexagonal crystal structure. A 200 Å-thick p-type $Al_{0.2}Ga_{0.8}N$ layer 108 doped with Mg is provided on the multiple quantum well active layer 107. The 200 Å-thick p-type $Al_{0.2}Ga_{0.8}N$ layer 108 has the hexagonal crystal structure. A 0.1 μm-thick p-type GaN optical guide layer 109 doped with Mg is provided on the 200 Å-thick p-type $Al_{0.2}Ga_{0.8}N$ layer 108. The 0.1 μm-thick p-type GaN optical guide layer 109 has the hexagonal crystal structure. A 0.4 μm-thick p-type $Al_{0.07}Ga_{0.93}N$ cladding layer 110 doped with Mg is provided on the 0.1 μm-thick p-type GaN optical guide layer 109. The 0.4 μm-thick p-type $Al_{0.07}Ga_{0.93}N$ cladding layer 110 has the hexagonal crystal structure. A 0.2 μm-thick p-type GaN layer 214 doped with Mg is provided on the 0.4 μm-thick p-type $Al_{0.07}Ga_{0.93}N$ cladding layer 110. The 0.2 μm-thick p-type GaN layer 214 has the hexagonal crystal structure. Further, 0.5 μm-thick n-type GaN current block layers 315 doped with Si are selectively provided on the 0.2 μm-thick p-type GaN layer 214. The 0.5 μm-thick n-type GaN current block layers 315 also have the hexagonal crystal structure. As will be described later, the 0.5 μm-thick n-type GaN current block layers 315 are formed by a selective growth of a metal organic chemical vapor deposition method using dielectric stripe masks, for which reason the 0.5 μm-thick n-type GaN current block layers 315 have highly flat and sloped inside walls. It is important that the 0.5 μm-thick n-type GaN current block layers 315 having the hexagonal crystal structure are selectively grown by the metal organic chemical vapor deposition method using dielectric stripe masks on the 0.2 μm-thick p-type GaN layer 214 having the hexagonal crystal structure. This results in the formation of the highly flat and sloped inside walls of the 0.5 μm-thick n-type GaN current block layers 315. The highly flat and sloped inside walls of the 0.5 μm-thick n-type GaN current block layers 315 cause current confinement as will be described later. A 0.3 μm-thick p-type GaN contact layer 111 doped with Mg is provided over the 0.2 μm-thick p-type GaN layer 214 as well as the highly flat and sloped inside walls and the top surfaces of the 0.5 μm-thick n-type GaN current block layers 315. A top surface of the 0.3 μm-thick p-type GaN contact layer 111 is flat. The 0.3 μm-thick p-type GaN contact layer 111 has the hexagonal crystal structure. A p-electrode 112 is provided which extends on the 0.3 μm-thick p-type GaN contact layer 111. The p-electrode 112 comprises a nickel layer laminated on the top flat surface of the 0.3 μm-thick p-type GaN contact layer 111 and a gold layer laminated on the nickel layer. An n-electrode 113 is provided on the recessed surface of the 3 μm-thick n-type GaN contact layer 103. The n-electrode 113 comprises a titanium layer laminated on the 3 μm-thick n-type GaN contact layer 103 and an aluminum layer laminated on the titanium layer.

As described above, since the 0.5 μm-thick n-type GaN current block layers 315 have an opposite conductivity type to that of the 0.2 μm-thick p-type GaN layer 214 and the 0.3 μm-thick p-type GaN contact layer 111, then the 0.5 μm-thick n-type GaN current block layers 315 are capable of blocking or guiding a current for current confinement. This current confinement allows a reduction in threshold current of the laser diode.

The above laser diode is formed as follows. The 300 Å-thick undoped GaN buffer layer 102 is grown by a metal organic chemical vapor deposition method at a low temperature on the flat (0001)-face sapphire substrate 101 so that the 300 Å-thick undoped GaN buffer layer 102 has a hexagonal crystal structure. The 3 μm-thick n-type GaN contact layer 103 doped with Si is grown by a metal organic chemical vapor deposition method on an entire surface of the 300 Å-thick undoped GaN buffer layer 102 so that the 3 μm-thick n-type GaN contact layer 103 has a hexagonal crystal structure. The 0.1 μm-thick n-type $In_{0.05}Ga_{0.95}N$ layer 104 doped with Si is grown by the metal organic chemical vapor deposition on the top surface of the ridged portion of the 3 μm-thick n-type GaN contact layer 103 so that the 0.1 μm-thick n-type $In_{0.05}Ga_{0.95}N$ layer 104 has a hexagonal crystal structure. The 0.4 μm-thick n-type $Al_{0.07}Ga_{0.93}N$ cladding layer 105 doped with Si is grown by the metal organic chemical vapor deposition on the 0.1 μm-thick n-type $In_{0.05}Ga_{0.95}N$ layer 104 so that the 0.4 μm-thick n-type $Al_{0.07}Ga_{0.93}N$ cladding layer 105 has the hexagonal crystal structure. The 0.1 μm-thick n-type GaN optical guide layer 106 doped with Si is grown by the metal organic chemical vapor deposition on the 0.4 μm-thick n-type $Al_{0.07}Ga_{0.93}N$ cladding layer 105 so that the 0.1 μm-thick n-type GaN optical guide layer 106 has the hexagonal crystal structure. The multiple quantum well active layer 107 is grown by the metal organic chemical vapor deposition on the 0.1 μm-thick n-type GaN optical guide layer 106, wherein the multiple quantum well active layer 107 comprises 7 periods of alternating 25 Å-thick undoped $In_{0.2}Ga_{0.8}N$ quantum well layers and 50 Å-thick undoped $In_{0.05}Ga_{0.95}N$ barrier layers. The 25 Å-thick undoped $In_{0.2}Ga_{0.8}N$ quantum well layers and the 50 Å-thick undoped $In_{0.05}Ga_{0.95}N$ barrier layers have the hexagonal crystal structure. The 200 Å-thick p-type $Al_{0.2}Ga_{0.8}N$ layer 108 doped with Mg is grown by the metal organic chemical vapor deposition on the multiple quantum well active layer 107 so that the 200 Å-thick p-type $Al_{0.2}Ga_{0.8}N$ layer 108 has the hexagonal crystal structure. The 200 Å-thick p-type $Al_{0.2}Ga_{0.8}N$ layer 108 is capable of preventing dissociation of indium from the multiple quantum well active layer 107. The 0.1 μm-thick p-type GaN optical guide layer 109 doped with Mg is grown by the metal organic chemical vapor deposition on the 200 Å-thick p-type $Al_{0.2}Ga_{0.8}N$ layer 108 so that the 0.1 μm-thick p-type GaN optical guide layer 109 has the hexagonal crystal structure. The 0.4 μm-thick p-type $Al_{0.07}Ga_{0.93}N$ cladding layer 110 doped with Mg is grown by the metal organic chemical vapor deposition on the 0.1 μm-thick p-type GaN optical guide layer 109 so that the 0.4 μm-thick p-type $Al_{0.07}Ga_{0.93}N$ cladding layer 110 has the hexagonal crystal structure. The 0.2 μm-thick p-type GaN layer 214 is grown by the metal organic chemical vapor deposition on the 0.4 μm-thick p-type $Al_{0.07}Ga_{0.93}N$ cladding layer 110 so that the 0.2 μm-thick p-type GaN layer 214 has the hexagonal crystal structure. Further, 2000 Å-thick silicon oxide stripe masks 215 are arranged on the 0.2 μm-thick p-type GaN layer 214 so that a longitudinal direction of the 2000 Å-thick silicon oxide stripe masks 215 is parallel to the [11–20] direction of the hexagonal crystal structure. The 2000 Å-thick silicon oxide stripe masks 215 defines a stripe-shaped opening and has a width of 5 μm. 0.5 μm-thick n-type GaN current block layers 315 doped with Si are selectively grown by the metal organic chemical vapor deposition on the 0.2 μm-thick p-type GaN layer 214 so that the 0.5 μm-thick n-type GaN current block layers 315 also have the hexagonal crystal structure. The 0.5 μm-thick n-type GaN current block layers 315 are grown by a selective growth of a metal organic chemical vapor deposition method using dielectric stripe masks, for which reason the 0.5 μm-thick n-type GaN current block layers 315 have highly flat and sloped inside walls. It is important that the 0.5 μm-thick n-type GaN current block layers 315 having the hexagonal crystal structure are selectively grown by the metal organic chemical vapor deposition method using dielectric stripe masks on the 0.2 μm-thick p-type GaN layer 214 having the hexagonal crystal structure. This results in the formation of the highly flat and sloped inside walls of the 0.5 μm-thick n-type GaN current block layers 315. The highly flat and sloped inside walls of the 0.5 μm-thick n-type GaN current block layers 315 cause current confinement. A 0.3 μm-thick p-type GaN contact layer 111 doped with Mg is grown by the metal organic chemical vapor deposition method over the 0.2 μm-thick p-type GaN layer 214 as well as the highly flat and sloped inside walls and the top surfaces of the 0.5 μm-thick n-type GaN current block layers 315 so that a top surface of the 0.3 μm-thick p-type GaN contact layer 111 is flat and the 0.3 μm-thick p-type GaN contact layer 111 has the hexagonal crystal structure. A nickel layer is laminated on the top flat surface of the 0.3 μm-thick p-type GaN contact layer 111 and a gold layer is laminated on the nickel layer thereby forming the p-electrode 112. A titanium layer is laminated on the 3 μm-thick n-type GaN contact layer 103 and an aluminum layer is laminated on the titanium layer thereby forming the n-electrode 113.

Since the 0.5 μm-thick n-type GaN current block layers 315 have an opposite conductivity type to that of the 0.2 μm-thick p-type GaN layer 214 and the 0.3 μm-thick p-type GaN contact layer 111, then the 0.5 μm-thick n-type GaN current block layers 315 are capable of blocking or guiding a current for current confinement. This current confinement allows a reduction in threshold current of the laser diode.

Since, further, the p-electrode 112 has a large contact area with the 0.3 μm-thick p-type GaN contact layer 111, a contact resistance between the p-electrode 112 and the 0.3 μm-thick p-type GaN contact layer 111 is small.

Furthermore, the above current confinement structure can be formed without use of the dry etching process.

Moreover, the multiple quantum well active layer 107 is formed on the flat surface. This results in no possibility of compositional modification or no variation in composition over position of the active layer.

Since the gallium nitride based compound semiconductor layers having the hexagonal crystal structure are selectively formed on the (0001)-face of the gallium nitride layer, then the gallium nitride based compound semiconductor layers are almost not grown in the [1–100] direction.

Namely, the 0.5 μm-thick n-type GaN current block layers 315 having the hexagonal structure are selectively grown on the (0001)-face of the 0.2 μm-thick p-type GaN layer 214 having the hexagonal crystal structure by use of the dielectric stripe masks arranged in a longitudinal direction along the [11–20] direction so that no extending portion over the dielectric stripe masks is formed.

In the above gallium nitride based compound semiconductor laser diode, an optical waveguide is formed in a direction along the [11–20] direction of the crystal structure. It is difficult to cleave the semiconductor wafer in the [11–20] direction. This means it difficult to form the reflective faces of resonator in the laser diode by the cleaving method. For this reason, it is necessary to form the reflective faces of resonator in the laser diode by other method such as dry etching.

Since the gallium nitride based compound semiconductor layers having the hexagonal crystal structure are selectively formed on the (0001)-face of the gallium nitride layer, then a growth rate of gallium nitride in the [11–20] direction is almost the same as that in the [0001] direction.

As a modification, the optical waveguide may be formed in a direction tilted from the [11–20] direction of the crystal structure by an angle in the range of ±5 degrees. Even if the optical waveguide is formed in a direction tilted from the [11–20] direction of the crystal structure by an angle over the range of ±5 degrees, then there is no problem unless the semiconductor layer is allowed to be selectively grown in the [11–20] direction. In the later case, however, it is necessary that the dielectric strip masks are almost the same in thickness as the current block layers.

Whereas in the above embodiment the semiconductor layers having the hexagonal crystal structure are grown on the (0001)-face of the sapphire substrate, it is also possible to grow the semiconductor layers having the hexagonal crystal structure on the (11–20)-face of the sapphire substrate.

Further, in place of the (0001)-face sapphire substrate and the (11–20)-face sapphire substrate, silicon oxide substrates with the (0001)-face or the (11–20)-face are available. Furthermore, $MgAl_2O_4$ substrates with the (0001)-face or the (11–20)-face are also available. Gallium nitride substrates with the (0001)-face or the (11–20)-face are still further available. The sapphire substrate, silicon oxide substrate, $MgAl_2O_4$ substrate, and gallium nitride substrate having other faces than the (0001)-face or the (11–20)-face are also available.

The above present invention can be applied not only to the gallium nitride based laser diode as illustrated in the drawings but also other gallium nitride based laser diodes which are different in thickness of layer, composition of layer, doping concentration of layer, material of electrode, martial of dielectric stripe masks, depth of dry etching, and width of stripe of the dielectric stripe masks.

Although in the above embodiment, the individual semiconductor layers have surfaces of the (0001)-face, the surfaces of the individual semiconductor layers may be tilted from the (0001)-face by an angle in the range of ±5 degrees.

Fifth Embodiment

Figure 11:
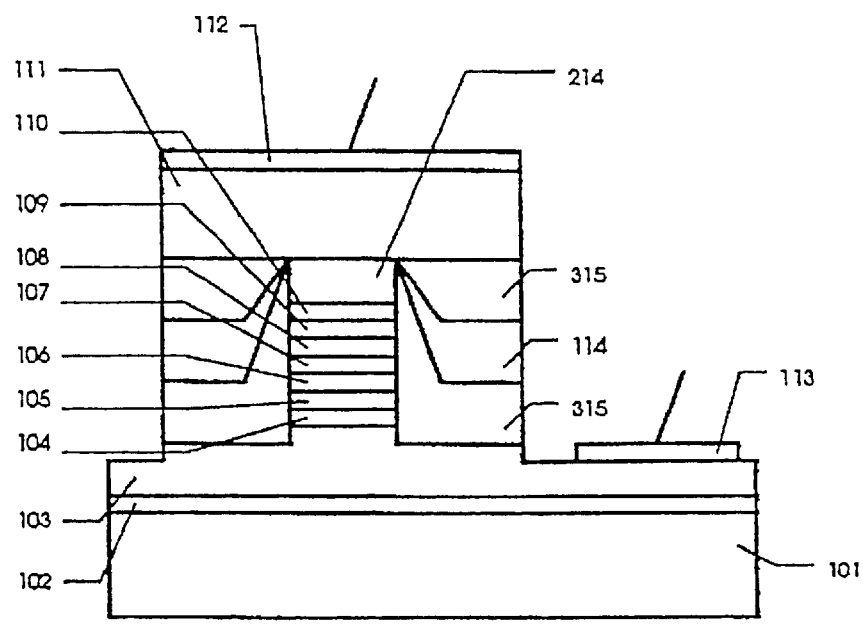
FIG. 11 is a fragmentary cross sectional elevation view illustrative of a novel gallium nitride based compound semiconductor laser having a current block layer structure for a current confinement in a fifth embodiment according to the present invention.
Figure 12:
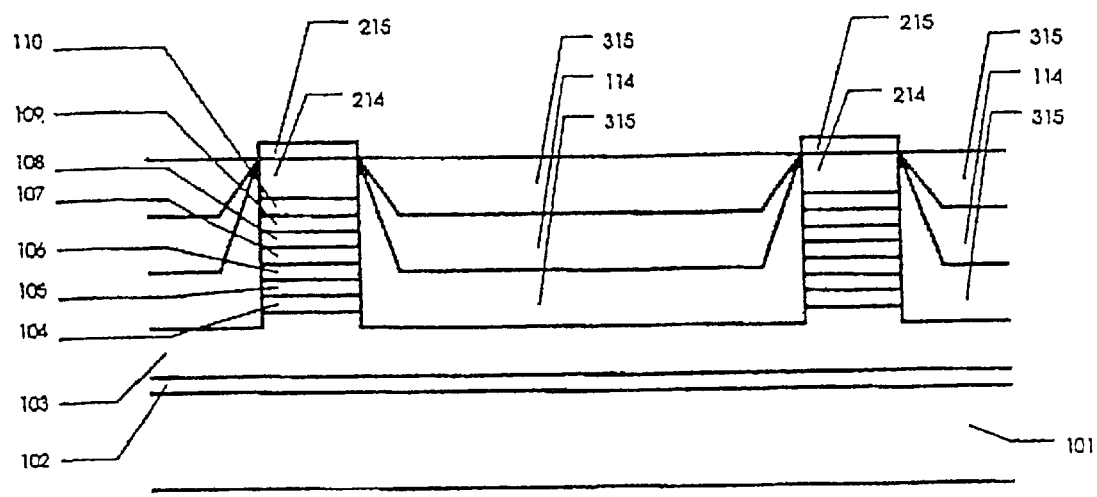
FIG. 12 is a fragmentary cross sectional elevation view illustrative of a novel gallium nitride based compound semiconductor laser in a selective growth process by a metal organic chemical vapor deposition method involved in a fabrication method thereof.

A fifth embodiment according to the present invention will be described with reference to FIGS. 11 and 12. FIG. 11 is a fragmentary cross sectional elevation view illustrative of a novel gallium nitride based compound semiconductor laser having a current block layer structure for a current confinement in a fifth embodiment according to the present invention. FIG. 12 is a fragmentary cross sectional elevation view illustrative of a novel gallium nitride based compound semiconductor laser in a selective growth process by a metal organic chemical vapor deposition method involved in a fabrication method thereof.

The novel gallium nitride based compound semiconductor laser is formed on a (0001)-face sapphire substrate 101. All of compound semiconductor layers in the novel gallium nitride based compound semiconductor laser have hexagonal crystal structures. The structure of the novel gallium nitride based compound semiconductor laser is as follows. A 300 Å-thick undoped GaN buffer layer 102 is provided on a (0001)-face sapphire substrate 101. The 300 Å-thick undoped GaN buffer layer 102 has a hexagonal crystal structure. A 3 $\mu$m-thick n-type GaN contact layer 103 doped with Si is provided on an entire surface of the 300 Å-thick undoped GaN buffer layer 102. The 3 $\mu$m-thick n-type GaN contact layer 103 has a hexagonal crystal structure. The 3 $\mu$m-thick n-type GaN contact layer 103 has a ridged portion and recess portions. A top surface of the ridged portion of the 3 $\mu$m-thick n-type GaN contact layer 103 is a flat surface. Upper surfaces of the recess portions of the 3 $\mu$m-thick n-type GaN contact layer 103 are also flat surfaces. A 0.1 $\mu$m-thick n-type $In_{0.05}Ga_{0.95}N$ layer 104 doped with Si is provided on the top flat surface of the ridged portion of the 3 $\mu$m-thick n-type GaN contact layer 103. The 0.1 $\mu$m-thick n-type $In_{0.05}Ga_{0.95}N$ layer 104 is capable of preventing crack in the compound semiconductor. A 0.4 $\mu$m-thick n-type $Al_{0.07}Ga_{0.93}N$ cladding layer 105 doped with Si is provided on the 0.1 $\mu$m-thick n-type $In_{0.05}Ga_{0.95}N$ layer 104. The 0.4 $\mu$m-thick n-type $Al_{0.07}Ga_{0.93}N$ cladding layer 105 has the hexagonal crystal structure. A 0.1 $\mu$m-thick n-type GaN optical guide layer 106 doped with Si is provided on the 0.4 $\mu$m-thick n-type $Al_{0.07}Ga_{0.93}N$ cladding layer 105. The 0.1 $\mu$m-thick n-type GaN optical guide layer 106 has the hexagonal crystal structure. A multiple quantum well active layer 107 is provided on the 0.1 $\mu$m-thick n-type GaN optical guide layer 106. The multiple quantum well active layer 107 comprises 7 periods of alternating 25 Å-thick undoped $In_{0.2}Ga_{0.8}N$ quantum well layers and 50 Å-thick undoped $In_{0.05}Ga_{0.95}N$ barrier layers. The 25 Å-thick undoped $In_{0.2}Ga_{0.8}N$ quantum well layers have the hexagonal crystal structure. The 50 Å-thick undoped $In_{0.05}Ga_{0.95}N$ barrier layers have the hexagonal crystal structure. A 200 Å-thick p-type $Al_{0.2}Ga_{0.8}N$ layer 108 doped with Mg is provided on the multiple quantum well active layer 107. The 200 Å-thick p-type $Al_{0.2}Ga_{0.8}N$ layer 108 has the hexagonal crystal structure. A 0.1 $\mu$m-thick p-type GaN optical guide layer 109 doped with Mg is provided on the 200 Å-thick p-type $Al_{0.2}Ga_{0.8}N$ layer 108. The 0.1 $\mu$m-thick p-type GaN optical guide layer 109 has the hexagonal crystal structure. A 0.4 $\mu$m-thick p-type $Al_{0.07}Ga_{0.93}N$ cladding layer 110 doped with Mg is provided on the 0.1 $\mu$m-thick p-type GaN optical guide layer 109. The 0.4 $\mu$m-thick p-type $Al_{0.07}Ga_{0.93}N$ cladding layer 110 has the hexagonal crystal structure. A 0.2 $\mu$m-thick p-type GaN layer 214 doped with Mg is provided on the 0.4 $\mu$m-thick p-type $Al_{0.07}Ga_{0.93}N$ cladding layer 110. The 0.2 $\mu$m-thick p-type GaN layer 214 has the hexagonal crystal structure. The above laminations of the 0.1 $\mu$m-thick n-type $In_{0.05}Ga_{0.95}N$ layer 104, the 0.4 $\mu$m-thick n-type $Al_{0.07}Ga_{0.93}N$ cladding layer 105, the 0.1 $\mu$m-thick n-type GaN optical guide layer 106, the multiple quantum well active layer 107, the 200 Å-thick p-type $Al_{0.2}Ga_{0.8}N$ layer 108, the 0.1 $\mu$m-thick p-type GaN optical guide layer 109, the 0.4 $\mu$m-thick p-type $Al_{0.07}Ga_{0.93}N$ cladding layer 110 and the 0.2 $\mu$m-thick p-type GaN layer 214 are in the form of a ridge. Further, GaN current block layer structures are provided on side walls of the ridge of the above laminations and over the 3 $\mu$m-thick n-type GaN contact layer 103. Each of the GaN current block layer structures comprise laminations of a 0.5 $\mu$m-thick n-type GaN current block layer 315 doped with Si, a 0.5 $\mu$m-thick p-type GaN current block layer 114 doped with Mg on the 0.5 $\mu$m-thick n-type GaN current block layers 315 and a 0.5 $\mu$m-thick n-type GaN current block layer 315 doped with Si on the 0.5 $\mu$m-thick p-type GaN current block layer 114. The 0.5 $\mu$m-thick n-type GaN current block layers 315 doped with Si are selectively provided on the side walls of the ridge of the above laminations of the layers and also over the 3 $\mu$m-thick n-type GaN contact layer 103. The 0.5 $\mu$m-thick n-type GaN current block layers 315 also have the hexagonal crystal structure. As will be described later, the 0.5 $\mu$m-thick n-type GaN current block layers 315 are grown by a selective growth of a metal organic chemical vapor deposition method using dielectric stripe masks arranged on a top of the ridge of the above laminations of the layers. It is important that the 0.5 $\mu$m-thick n-type GaN current block layers 315 having the hexagonal crystal structure are selectively grown by the metal organic chemical vapor deposition method using dielectric stripe masks on the side walls of the ridge of the above laminations of the layers having the hexagonal crystal structure and also over the 3 $\mu$m-thick n-type GaN contact layer 103 having the hexagonal crystal structure. Subsequently, the 0.5 $\mu$m-thick p-type GaN current block layers 114 doped with Mg are also grown on the 0.5 $\mu$m-thick n-type GaN current block layers 315 by the selective growth of the metal organic chemical vapor deposition method using dielectric stripe masks arranged on a top of the ridge of the above laminations of the layers. It is also important that the 0.5 $\mu$m-thick p-type GaN current block layers 114 having the hexagonal crystal structure are selectively grown on the 0.5 $\mu$m-thick n-type GaN current block layers 315 having the hexagonal crystal structure by the metal organic chemical vapor deposition method using dielectric stripe masks. Then, the 0.5 $\mu$m-thick n-type GaN current block layers 315 are grown by the selective growth of the metal organic chemical vapor deposition method using dielectric stripe masks arranged on the top of the ridge of the above laminations of the layers. It is also important that the 0.5 $\mu$m-thick n-type GaN current block layers 315 having the hexagonal crystal structure are selectively grown on the 0.5 $\mu$m-thick p-type GaN current block layers 114 having the hexagonal crystal structure by the metal organic chemical vapor deposition method using dielectric stripe masks. Top surfaces of the upper 0.5 $\mu$m-thick n-type GaN current block layers 315 have the same level as a top surface of the 0.2 $\mu$m-thick p-type GaN layer 214 or the top of the ridge of the above laminations of layer. The current block layer structures of laminations of the 0.5 $\mu$m-thick n-type GaN current block layers 315, the 0.2 $\mu$m-thick p-type GaN layer 214 and the 0.5 $\mu$m-thick n-type GaN current block layers 315 cause current confinement as will be described later. A 0.2 $\mu$m-thick p-type GaN contact layer 111 doped with Mg is provided over the 0.2 $\mu$m-thick p-type GaN layer 214 as well as the top surfaces of the upper 0.5 $\mu$m-thick n-type GaN current block layers 315. A top surface of the 0.2 $\mu$m-thick p-type GaN contact layer 111 is flat. The 0.2 $\mu$m-thick p-type GaN contact layer 111 has the hexagonal crystal structure. A p-electrode 112 is provided which extends on the 0.2 $\mu$m-thick p-type GaN contact layer 111.

The p-electrode 112 comprises a nickel layer laminated on the top flat surface of the 0.2 μm-thick p-type GaN contact layer 111 and a gold layer laminated on the nickel layer. An n-electrode 113 is provided on the recessed surface of the 3 μm-thick n-type GaN contact layer 103. The n-electrode 113 comprises a titanium layer laminated on the 3 μm-thick n-type GaN contact layer 103 and an aluminum layer laminated on the titanium layer.

As described above, since the 0.5 μm-thick n-type GaN current block layers 315 have an opposite conductivity type to that of the 0.2 μm-thick p-type GaN layer 214 and the 0.2 μm-thick p-type GaN contact layer 111, then the 0.5 μm-thick n-type GaN current block layers 315 are capable of blocking or guiding a current for current confinement. This current confinement allows a reduction in threshold current of the laser diode.

The above laser diode is formed as follows. The 300 Å-thick undoped GaN buffer layer 102 is grown by a metal organic chemical vapor deposition method at a low temperature on the flat (0001)-face sapphire substrate 101 so that the 300 Å-thick undoped GaN buffer layer 102 has a hexagonal crystal structure. The 3 μm-thick n-type GaN contact layer 103 doped with Si is grown by a metal organic chemical vapor deposition method on an entire surface of the 300 Å-thick undoped GaN buffer layer 102 so that the 3 μm-thick n-type GaN contact layer 103 has a hexagonal crystal structure. The 0.1 μm-thick n-type $In_{0.05}Ga_{0.95}N$ layer 104 doped with Si is grown by the metal organic chemical vapor deposition on the top surface of the ridged portion of the 3 μm-thick n-type GaN contact layer 103 so that the 0.1 μm-thick n-type $In_{0.05}Ga_{0.95}N$ layer 104 has a hexagonal crystal structure. The 0.4 μm-thick n-type $Al_{0.07}Ga_{0.93}N$ cladding layer 105 doped with Si is grown by the metal organic chemical vapor deposition on the 0.1 μm-thick n-type $In_{0.05}Ga_{0.95}N$ layer 104 so that the 0.4 μm-thick n-type $Al_{0.07}Ga_{0.93}N$ cladding layer 105 has the hexagonal crystal structure. The 0.1 μm-thick n-type GaN optical guide layer 106 doped with Si is grown by the metal organic chemical vapor deposition on the 0.4 μm-thick n-type $Al_{0.07}Ga_{0.93}N$ cladding layer 105 so that the 0.1 μm-thick n-type GaN optical guide layer 106 has the hexagonal crystal structure. The multiple quantum well active layer 107 is grown by the metal organic chemical vapor deposition on the 0.1 μm-thick n-type GaN optical guide layer 106, wherein the multiple quantum well active layer 107 comprises 7 periods of alternating 25 Å-thick undoped $In_{0.2}Ga_{0.8}N$ quantum well layers and 50 Å-thick undoped $In_{0.05}Ga_{0.95}N$ barrier layers. The 25 Å-thick undoped $In_{0.2}Ga_{0.8}N$ quantum well layers and the 50 Å-thick undoped $In_{0.05}Ga_{0.95}N$ barrier layers have the hexagonal crystal structure. The 200 Å-thick p-type $Al_{0.2}Ga_{0.8}N$ layer 108 doped with Mg is grown by the metal organic chemical vapor deposition on the multiple quantum well active layer 107 so that the 200 Å-thick p-type $Al_{0.2}Ga_{0.8}N$ layer 108 has the hexagonal crystal structure. The 200 Å-thick p-type $Al_{0.2}Ga_{0.8}N$ layer 108 is capable of preventing dissociation of indium from the multiple quantum well active layer 107. The 0.1 μm-thick p-type GaN optical guide layer 109 doped with Mg is grown by the metal organic chemical vapor deposition on the 200 Å-thick p-type $Al_{0.2}Ga_{0.8}N$ layer 108 so that the 0.1 μm-thick p-type GaN optical guide layer 109 has the hexagonal crystal structure. The 0.4 μm-thick p-type $Al_{0.07}Ga_{0.93}N$ cladding layer 110 doped with Mg is grown by the metal organic chemical vapor deposition on the 0.1 μm-thick p-type GaN optical guide layer 109 so that the 0.4 μm-thick p-type $Al_{0.07}Ga_{0.93}N$ cladding layer 110 has the hexagonal crystal structure. The 0.2 μm-thick p-type GaN layer 214 is grown by the metal organic chemical vapor deposition on the 0.4 μm-thick p-type $Al_{0.07}Ga_{0.93}N$ cladding layer 110 so that the 0.2 μm-thick p-type GaN layer 214 has the hexagonal crystal structure. Further, 2000 Å-thick silicon oxide stripe masks 215 are arranged on the 0.2 μm-thick p-type GaN layer 214 so that a longitudinal direction of the 2000 Å-thick silicon oxide stripe masks 215 is parallel to the [11–20] direction of the hexagonal crystal structure. The 2000 Å-thick silicon oxide stripe masks 215 defines a stripe-shaped opening and has a width of 1 μm. A reactive ion etching is carried out to selectively remove the above laminations of the 0.1 μm-thick n-type $In_{0.05}Ga_{0.95}N$ layer 104, the 0.4 μm-thick n-type $Al_{0.07}Ga_{0.93}N$ cladding layer 105, the 0.1 μm-thick n-type GaN optical guide layer 106, the multiple quantum well active layer 107, the 200 Å-thick p-type $Al_{0.2}Ga_{0.8}N$ layer 108, the 0.1 μm-thick p-type GaN optical guide layer 109, the 0.4 μm-thick p-type $Al_{0.07}Ga_{0.93}N$ cladding layer 110 and the 0.2 μm-thick p-type GaN layer 214 and further the 3 μm-thick n-type GaN contact layer 103. As a result, the ridge is formed which comprises the above semiconductor layers having the hexagonal crystal structure. Further, GaN current block layer structures are formed on side walls of the ridge of the above laminations and over the 3 μm-thick n-type GaN contact layer 103. The 0.5 μm-thick n-type GaN current block layers 315 doped with Si are selectively grown on the side walls of the ridge of the above laminations of the layers and also over the 3 μm-thick n-type GaN contact layer 103 by the metal organic chemical vapor deposition method using the above 2000 Å-thick silicon oxide stripe masks 215 so that the 0.5 μm-thick n-type GaN current block layers 315 also have the hexagonal crystal structure. It is important that the 0.5 μm-thick n-type GaN current block layers 315 having the hexagonal crystal structure are selectively grown by the metal organic chemical vapor deposition method using dielectric stripe masks on the side walls of the ridge of the above laminations of the layers having the hexagonal crystal structure and also over the 3 μm-thick n-type GaN contact layer 103 having the hexagonal crystal structure. Subsequently, the 0.5 μm-thick p-type GaN current block layers 114 doped with Mg are also grown on the 0.5 μm-thick n-type GaN current block layers 315 by the selective growth of the metal organic chemical vapor deposition method using dielectric stripe masks arranged on the top of the ridge of the above laminations of the layers. It is also important that the 0.5 μm-thick p-type GaN current block layers 114 having the hexagonal crystal structure are selectively grown on the 0.5 μm-thick n-type GaN current block layers 315 having the hexagonal crystal structure by the metal organic chemical vapor deposition method using dielectric stripe masks. Then, the 0.5 μm-thick n-type GaN current block layers 315 are grown by the selective growth of the metal organic chemical vapor deposition method using dielectric stripe masks arranged on the top of the ridge of the above laminations of the layers. It is also important that the 0.5 μm-thick n-type GaN current block layers 315 having the hexagonal crystal structure are selectively grown on the 0.5 μm-thick p-type GaN current block layers 114 having the hexagonal crystal structure by the metal organic chemical vapor deposition method using dielectric stripe masks. Top surfaces of the upper 0.5 μm-thick n-type GaN current block layers 315 have the same level as a top surface of the 0.2 μm-thick p-type GaN layer 214 or the top of the ridge of the above laminations of layer. The current block layer structures of laminations of the 0.5 μm-thick n-type GaN current block layers 315, the 0.2 μm-thick p-type GaN layer 214 and the 0.5 μm-thick n-type GaN current block layers 315 cause current confinement. The used 2000 Å-thick silicon oxide stripe masks 215 are removed. A 0.3 μm-thick p-type GaN contact layer 111 doped with Mg is grown by the metal organic chemical vapor deposition method over the 0.2 μm-thick p-type GaN layer 214 as well as the top surfaces of the upper 0.5 μm-thick n-type GaN current block layers 315 so that a top surface of the 0.3 μm-thick p-type GaN contact layer 111 is flat and the 0.3 μm-thick p-type GaN contact layer 111 has the hexagonal crystal structure. A p-electrode 112 is provided which extends on the 0.3 μm-thick p-type GaN contact layer 111. The p-electrode 112 comprises a nickel layer laminated on the top flat surface of the 0.3 μm-thick p-type GaN contact layer 111 and a gold layer laminated on the nickel layer. An n-electrode 113 is provided on the recessed surface of the 3 μm-thick n-type GaN contact layer 103. The n-electrode 113 comprises a titanium layer laminated on the 3 μm-thick n-type GaN contact layer 103 and an aluminum layer laminated on the titanium layer.

Since the 0.5 μm-thick n-type GaN current block layers 315 have an opposite conductivity type to that of the 0.2 μm-thick p-type GaN layer 214 and the 0.2 μm-thick p-type GaN contact layer 111, then the 0.5 μm-thick n-type GaN current block layers 315 are capable of blocking or guiding a current for current confinement. This current confinement allows a reduction in threshold current of the laser diode.

Since, further, the p-electrode 112 has a large contact area with the 0.3 μm-thick p-type GaN contact layer 111, a contact resistance between the p-electrode 112 and the 0.3 μm-thick p-type GaN contact layer 111 is small.

Furthermore, the above current confinement structure can be formed without use of the dry etching process.

Moreover, the multiple quantum well active layer 107 is formed on the flat surface. This results in no possibility of compositional modification or no variation in composition over position of the active layer.

Namely, the 0.5 μm-thick n-type GaN current block layers 315 having the hexagonal structure are selectively grown on the (0001)-face of the 0.2 μm-thick p-type GaN layer 214 having the hexagonal crystal structure and the 3 μm-thick n-type GaN contact layer 103 having the hexagonal crystal structure by use of the dielectric stripe masks arranged in a longitudinal direction along the [1–100] direction so that an optical waveguide is formed in a direction along the [1–100] direction of the crystal structure. It is, therefore, possible to cleave the semiconductor wafer in the [1–100] direction. This means it possible to form the reflective faces of resonator in the laser diode by the cleaving method.

As a modification, the optical waveguide may be formed in a direction tilted from the [1–100] direction of the crystal structure by an angle in the range of±5 degrees. Even if the optical waveguide is formed in a direction tilted from the [1–100] direction of the crystal structure by an angle over the range of±5 degrees, then it is difficult to cleave the semiconductor wafer, for which reason the reflective faces of resonator in the laser diode are formed by other methods such as dry etching than the cleaving method.

Whereas in the above embodiment the semiconductor layers having the hexagonal crystal structure are grown on the (0001)-face of the sapphire substrate, it is also possible to grow the semiconductor layers having the hexagonal crystal structure on the (11–20)-face of the sapphire substrate.

Further, in place of the (0001)-face sapphire substrate and the (11–20)-face sapphire substrate, silicon oxide substrates with the (0001)-face or the (11–20)-face are also available.

Furthermore, $MgAl_2O_4$ substrates with the (0001)-face or the (11–20)-face are also available. Gallium nitride substrates with the (0001)-face or the (11–20)-face are still further available. The sapphire substrate, silicon oxide substrate, $MgAl_2O_4$ substrate, and gallium nitride substrate having other faces than the (0001)-face or the (11–20)-face are also available.

The above present invention can be applied not only to the gallium nitride based laser diode as illustrated in the drawings but also other gallium nitride based laser diodes which are different in thickness of layer, composition of layer, doping concentration of layer, material of electrode, martial of dielectric stripe masks, depth of dry etching, and width of stripe of the dielectric stripe masks.

Although in the above embodiment, the individual semiconductor layers have surfaces of the (0001)-face, the surfaces of the individual semiconductor layers may be tilted from the (0001)-face by an angle in the range of±5 degrees.

Sixth Embodiment

Figure 13:
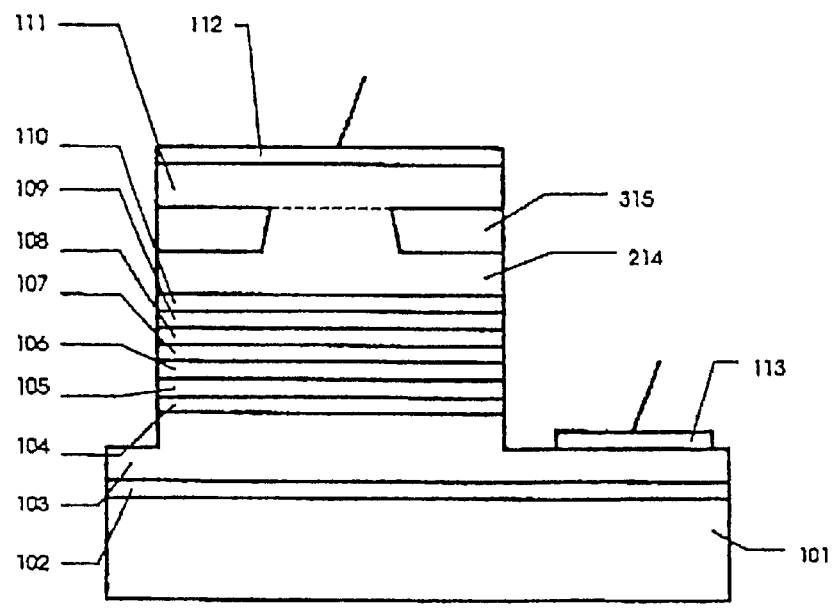
FIG. 13 is a fragmentary cross sectional elevation view illustrative of a novel gallium nitride based compound semiconductor laser having a current block layer structure for a current confinement in a sixth embodiment according to the present invention.
Figure 14:
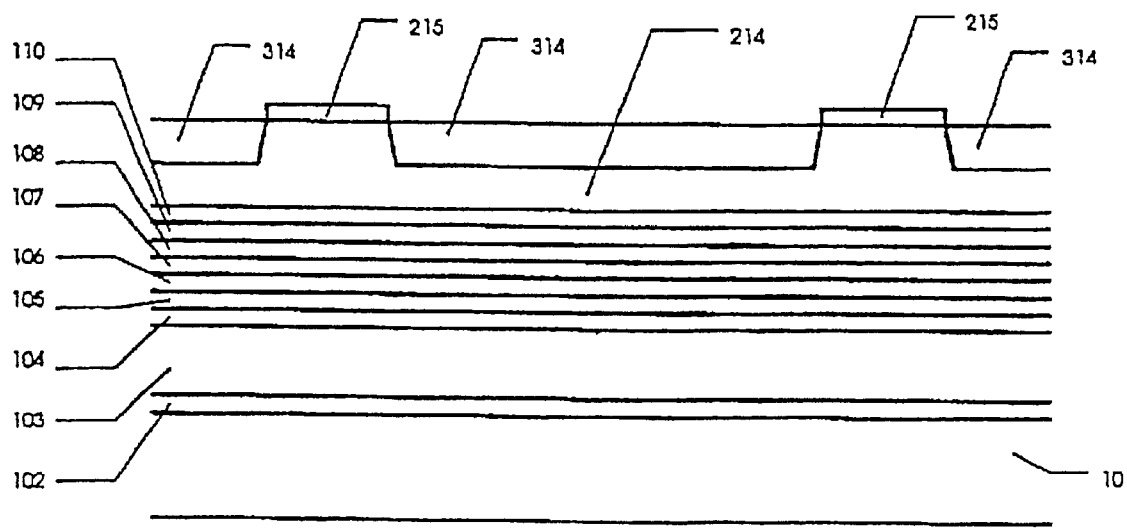
FIG. 14 is a fragmentary cross sectional elevation view illustrative of a novel gallium nitride based compound semiconductor laser in a selective growth process by a metal organic chemical vapor depression method involved in a fabrication method thereof.

A sixth embodiment according to the present invention will be described with reference to FIGS. 13 and 14. FIG. 13 is a fragmentary cross sectional elevation view illustrative of a novel gallium nitride based compound semiconductor laser having a current block layer structure for a current confinement in a sixth embodiment according to the present invention. FIG. 14 is a fragmentary cross sectional elevation view illustrative of a novel gallium nitride based compound semiconductor laser in a selective growth process by a metal organic chemical vapor deposition method involved in a fabrication method thereof.

The novel gallium nitride based compound semiconductor laser is formed on a (0001)-face sapphire substrate 101. All of compound semiconductor layers in the novel gallium nitride based compound semiconductor laser have hexagonal crystal structures. The structure of the novel gallium nitride based compound semiconductor laser is as follows. A 300 Å-thick undoped GaN buffer layer 102 is provided on a (0001)-face sapphire substrate 101. The 300 Å-thick undoped GaN buffer layer 102 has a hexagonal crystal structure. A 3 μm-thick n-type GaN contact layer 103 doped with Si is provided on an entire surface of the 300 Å-thick undoped GaN buffer layer 102. The 3 μm-thick n-type GaN contack layer 103 has a hexagonal crystal structure. The 3 μm-thick n-type GaN contact layer 103 has a ridged portion and recess portions. A top surface of the ridged portion of the 3 μm-thick n-type GaN contact layer 103 is a flat surface. Upper surfaces of the recess portions of the 3 μm-thick n-type GaN contact layer 103 are also flat surfaces. A 0.1 μm-thick n-type $In_{0.05}Ga_{0.95}N$ layer 104 doped with Si is provided on the top flat surface of the ridged portion of the 3 μm-thick n-type GaN contact layer 103. The 0.1 μm-thick n-type $In_{0.05}Ga_{0.95}N$ layer 104 is capable of preventing crack in the compound semiconductor. A 0.4 μm-thick n-type $Al_{0.07}Ga_{0.93}N$ cladding layer 105 doped with Si is provided on the 0.1 μm-thick n-type $In_{0.05}Ga_{0.95}N$ layer 104. The 0.4 μm-thick n-type $Al_{0.07}Ga_{0.93}N$ cladding layer 105 has the hexagonal crystal structure. A 0.1 μm-thick n-type GaN optical guide layer 106 doped with Si is provided on the 0.4 μm-thick n-type $Al_{0.07}Ga_{0.93}N$ cladding layer 105. The 0.1 μm-thick n-type GaN optical guide layer 106 has the hexagonal crystal structure. A multiple quantum well active layer 107 is provided on the 0.1 μm-thick n-type GaN optical guide layer 106. The multiple quantum well active layer 107 comprises 7 periods of alternating 25 Å-thick undoped $In_{0.02}Ga_{0.8}N$ quantum well layers and 50 Å-thick undoped $In_{0.05}Ga_{0.95}N$ barrier layers. The 25 Å-thick undoped $In_{0.2}Ga_{0.8}N$ quantum well layers have the hexagonal crystal structure. The 50 Å-thick undoped $In_{0.05}Ga_{0.95}N$ barrier layers have the hexagonal crystal structure. A 200 Å-thick p-type $Al_{2.0}Ga_{0.8}n$ layer 108 doped with Mg is provided on the multiple quantum well active layer 107. The 200 Å-thick p-type $Al_{0.2}Ga_{0.8}N$ layer 108 has the hexagonal crystal structure. A 0.1 μm-thick p-type GaN optical guide layer 109 doped with Mg is provided on the 200 Å-thick p-type $Al_{0.2}Ga_{0.8}N$ layer 108. The 0.1 μm-thick p-type GaN optical guide layer 109 has the hexagonal crystal structure. A 0.4 μm-thick p-type $Al_{0.07}Ga_{0.93}N$ cladding layer 110 doped with Mg is provided on the 0.1 μm-thick p-type GaN optical guide layer 109. The 0.4 μm-thick p-type $Al_{0.07}Ga_{0.93}N$ cladding layer 110 has the hexagonal crystal structure. A 0.2 μm-thick p-type GaN layer 214 doped with Mg is provided on the 0.4 μm-thick p-type $Al_{0.07}Ga_{0.93}N$ cladding layer 110. The 0.2 μm-thick p-type GaN layer 214 has the hexagonal crystal struture. The 0.2 m-thick p-type GaN layer 214 has a ridged portion and flat base portions. Further, 0.5 μm-thick n-type GaN current block layers 315 doped with Si are selectively provided on the side walls of the ridged portion of the 0.2 μm-thick p-type GaN layer and also over the flat base portions of the 0.2 μm-thick p-type GaN layer 214. The 0.5 μm-thick p-type GaN current block layers 315 also have the hexagonal crystal structure. As will be described later, the 0.5 μm-thick n-type GaN current block layers 315 are grown by a selective growth of a metal organic chemical vapor deposition method using dielectric stripe masks arranged on a top of the ridged portion of the 0.2 m-thick p-type GaN layer 214. It is important that the 0.5 μm-thick n-type GaN current block layers 315 having the hexagonal crystal structure are selectively grown by the metal organic chemical vapor deposition method using dielectric stripe masks on the side walls of the ridged portion of the 0.2 μm-thick p-type GaN layer 214 and also over the flat base poritons of the 0.2 μm-thick p-type GaN layer 214 having the hexagonal crystal structure. Top surfaces of the 0.5 μm-thick n-type GaN current block layers 315 have the same level as a top surface of the 0.2 μm-tick p-type GaN layer 214. The current block layer structure of the 0.5 μm-thick n-type GaN current block layers 315 cause current confinement as will be descrived later. A 0.3 μm-thick p-type GaN contact layer 111 doped with Mg is provided over the 0.2 μm-thick p-type GaN layer 214 as well as the top surfaces of the upper 0.5 μm-thick p-type GaN current block layers 315. A top surface of the 0.3 μm-thick p-type GaN contact layer 111 is flat. The 3.0 μm-thick p-type GaN contact layer 111 has the hexagonal crystal structure. A p-electrode 112 is provided which extends on the 0.3 μm-thick p-type GaN contact layer 111. The p-electrode 112 comprises a nickel layer laminated on the top flat surface of the 0.3 μm-thick p-type GaN contact layer 111 and a gold layer laminated on the nickel layer. An n-electrode 113 is provided on the recessed surface of the 3 μm-thick n-type GaN contact layer 103. The n-electrode 113 comprises a titanium layer laminated on the 3 μm-thick n-type GaN contack layer 103 and an aluminum layer laminated on the titanium layer.

As described above, since the 0.5 μm-thick n-type GaN current block layers 315 have an opposite conductivity type to that of the 0.2 μm-thick p-type GaN layer 214 and the 0.3 μm-thick p-type GaN contact layer 111, then the 0.5 μm-thick n-type GaN current block layers 315 are capable of blocking or guiding a current for current confinement. This current confinement allows a reduction in threshold current of the laser diode.

The above laser diode is formed as follows. The 300 Å-thick undoped GaN buffer layer 102 is grown by a metal organic chemical vapor deposition method at a low temperature on the flat (0001)-face sapphire substrate 101 so that the 300 Å-thick undoped GaN buffer layer 102 has a hexagnoal crystal structure. The 3 μm-thick n-type GaN contact layer 103 doped with Si is grown by a metal organic chemical vapor deposition method on an entire surface of the 300 Å-thick undoped GaN buffer layer 102 so that the 3 μm-thick n-type GaN contact layer 103 has a hexagonal crystal structure. The 0.1 μm-thick n-type $In_{0.05}Ga_{0.95}N$ layer 104 doped with Si is grown by the metal organic chemical vapor deposition on the top surface of the ridged portion of the 3 μm-thick n-type GaN contact layer 103 so that the 0.1 μm-thick n-type $In_{0.05}Ga_{0.95}N$ layer 104 has a hexagonal crystal structure. The 0.4 μm-thick n-type $Al_{0.07}Ga_{0.93}N$ cladding layer 105 doped with Si is grown by the metal organic chemical vapor deposition on the 0.1 μm-thick n-type $In_{0.05}Ga_{0.95}N$ layer 104 so that the 0.4 μm-thick n-type $Al_{0.07}Ga_{0.93}N$ cladding layer 105 has the hexagonal crystal structure. The 0.1 μm-thick n-type GaN optical guide layer 106 doped with Si is grown by the metal organic chemical vapor deposition on the 0.4 μm-thick n-type $Al_{0.07}Ga_{0.93}N$ cladding layer 105 so that the 0.1 m-thick n-type GaN optical guide layer 106 has the hexagonal crystal structure. The mulitple quantum well active layer 107 is grown by the metal organic chemical vapor deposition on the 0.1 μm-thick n-type GaN optical guide layer 106, wherein the multiple quantum well active layer 107 comprises 7 periods of alternating 25 Å-thick undoped $In_{0.2}Ga_{0.8}N$ quantum well layers and 50 Å-thick undoped $In_{0.5}Ga_{0.95}N$ barrier layers. The 25 Å-thick undoped $In_{0.2}Ga_{0.8}N$ quantum well layers and the 50 Å-thick undoped $In_{0.05}Ga_{0.95}N$ barrier layers have the hexagonal crystal structure. The 200 Å-thick p-type $Al0.2Ga_{0.8}N$ layer 108 doped with Mg is grown by the metal organic chemical vapor deposition on the multiple guantum well active layer 107 so that the 200 Å-thick p-type $Al_{0.2}Ga_{0.8}N$ layer 108 has the hexagonal crystal structure. The 200 Å-thick p-type $Al_{0.2}Ga_{0.8}N$ layer 108 is capable of preventing dissociation of indium from the multiple quantum well active layer 107. The 0.1 μm-thick p-type GaN optical guide layer 109 doped with Mg is grown by the metal organic chemical vapor deposition on the 200 Åm-thick p-type $Al_{0.2}Ga_{0.8}N$ layer 108 so that the 0.1 82 m-thick p-type GaN optical guide layer 109 has the hexagonal crystal structure. The 0.4 μm-thick p-type $Al_{0.07}Ga_{0.93}N$ cladding layer 110 doped with Mg is grwon by the metal organic chemical vapor deposition on the 0.1 μm-thick p-type GaN optical guide layer 109 so that the 0.4 μm-thick p-type $Al_{0.07}Ga_{0.93}N$ cladding layer 110 has the hexagonal crystal structure. The 0.2 μm-thick p-type GaN layer 214 is grown by the metal organic chemical vapor deposition on the 0.4 μm-thick p-type $Al_{0.07}Ga_{0.93}N$ cladding layer 110 so that the 0.2 μm-thick p-type GaN layer 214 has the hexagonal crystal structure. Further, 2000 Å-thick silicon oxide stripe masks 215 are arranged on the 0.2 μm-thick p-type GaN layer 214 so that a longitudinal direction of the 200 Å-thick silicon oxide stripe masks 215 is parallel to the [11–20] direction of the hexagonal crystal structure. The 2000 Å-thick silicon oxide stripe masks 215 defines a stripe-shaped opening and has a width of 1 μm. A reactive ion etching is carried out to selectively remove parts of the 0.2 μm-thick p-type GaN layer 214. As a result, the ridge portion is formed. Further, 0.5 μm-thick n-type GaN current block layers 315 doped with Si are selectively grown on the side walls of the ridged portion of the 0.2 μm-thick p-type GaN layer 214 and also over the flat base portions of the 0.2 μm-thick p-type GaN layer 214 by the metal organic chemical vapor deposition method using the 2000 Å-thick silicon oxide stripe masks 215 so that the 0.5 μm-thick n-type GaN current block layers 315 also have the hexagonal crystal structure. The 0.5 μm-thick n-type GaN current block layers 315 are grown by a selective growth of a metal organic chemical vapor deposition method using dielectric stripe masks arranged on a top of the ridged portion of the 0.2 μm-thick p-type GaN layer 214. It is important that the 0.5 μm-thick n-type type GaN current block layers 315 having the hexagonal crystal structure are selectively grown by the metal organic chemical vapor deposition method using dielectric stripe masks on the side walls of the ridged portion of the 0.2 μm-thick p-type GaN layer 214 and also over the flat base portions of the 0.2 μm-thick p-type GaN layer 214 having the hexagonal crystal structure. Top surfaces of the 0.5 μm-thick n-type GaN current block layers 315 have the same level as a top surface of the 0.2 μm-thick p-type type GaN layer 214. The current block layer structure of the 0.5 μm-thick n-type GaN current block layers 315 cause current confinement. The used 2000 Å-thick silicon oxide stripe masks 215 are removed. A 0.3 μm-thick p-type GaN contact layer 111 doped with Mg is provided over the 0.2 μm-thick p-type GaN layer 214 as well as the top surfaces of the upper 0.5 m-thick n-type GaN current block layers 315. A top surface of the 0.3 μm-thick p-type GaN contact layer 111 is flat. The 0.3 μm-thick p-type GaN contact layer 111 has the hexagonal crystal structure. A p-electrode 112 is formed which extends on the 0.3 μm-thick p-type GaN contact layer 111. The p-electrode 112 comprises a nickel layer laminated on the top flat surface of the 0.3 μm-thick p-type GaN contact layer 111 and a gold layer laminated on the nickel layer. An n-electrode 113 is formed on the recessed surface of the 3 μm-thick n-type GaN contact layer 103. The n-electrode 113 comprises a titanium layer laminated on the 3 μm-thick n-type GaN contact layer 103 and an aluminum layer laminated on the titanium layer.

Since the 0.5 μm-thick n-type GaN current block layers 315 have an opposite conductivity type to that of the 0.2 μm-thick p-type GaN layer 214 and the 0.2 μm-thick p-type GaN contact layer 111, then the 0.5 μm-thick n-type GaN current block layers 315 are capable of blocking or guiding a current for current confinement. This current confienement allows a reduction in threshold current of the laser diode.

Since, further, the p-electrode 112 has a large contact area with the 0.3 μm-thick p-type GaN contact layer 111, a contact resistance between the p-electrode 112 and the 0.3 μm-thick p-type GaN contact layer 111 is small.

Furthermore, the above current confinement structure can be formed without use of the dry etching process to the active layer.

Moreover, the multiple quantum well active layer 107 is formed on the flat surface. This results in no possiblity of compositional modification or no variation in composition over position of the active layer.

Namely, the 0.5 μm-thick n-type GaN current block layers 315 having the hexagonal structure are selectively grown on the (0001)-face of the 0.2 μm-thick p-type GaN layer 214 having the hexagonal crystal structure and the 3 μm-thick n-type GaN contact layer 103 having the hexagonal crystal structure by use of the dielectric stripe masks arranged in a lognitudinal dirccetion along the [1–100] direction so that an optical waveguide is formed in a direction along the [1–100] direction of the crystal structure. It is, therefore, possible to cleave the semiconductor wafer in the [1–100] direction. This means it possible to form the reflective faces of resonator in the laser diode by the cleaving method.

As a modification, the optical waveguide may be formed in a direction tilted from the [1–100] direction of the crystal structure by an angle in the range of±5 degrees. Even if the optical waveguide is formed in a direction tilted from the [1–100] direction of the crystal structure by an angle over the range of±5 degrees, then it is difficult to cleave the semiconductor wafer, for which reason the reflective faces of resonator in the laser diode are formed by other methods such as dry etching than the cleaving method.

Whereas in the above embodiment the semiconductor layers having the hexagonal crystal structure are grown on the (0001)-face of the sapphire substrate, it is also possible to grow the semiconductor layers having the hexagonal crystal structure on the (11–20)-face of the sapphire substrate.

Further, in place of the (0001)-face sapphire substrate and the (11–20)-face sapphire substrate, silicon oxide substrates with the (0001)-face or the (11–20)-face are available. Furthermore, MgAl$_2$O$_4$ substrates with the (0001)-face or the (11–20)-face are also available. Gallium nitride substrates with the (0001)-face or the (11–20)-face are still further available. The sapphire substrate, silicon oxide substrate MgAl$_2$O$_4$ substrate, and gallium nitride substrate having other faces than the (0001)-face or the (11–20)-face are also available.

The above present invention can be applied not only to the gallium nitride based laser diode as illustrated in the drawings but also other gallium nitride based laser diodes which are different in thickness of layer, composition of layer, doping concentration of layer, material of electrode, martial of dielectric stripe masks, depth of dry etching, and width of stripe of the dielectric stripe masks.

Although in the above embodiment, the individual semiconductor layers have surfaces of the (0001)-face, the surfaces of the individual semiconductor layers may be tilted from the (0001)-face by an angle in the range of±5 degrees.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a current block layer structure in a compound semiconductor laser device, comprising the steps of:

providing dielectric stripe masks defining at least a stripe-shaped opening on a surface of a compound semiconductor region having hexagonal crystal structure; and selectively growing at least a current blocking layer of a compound semiconductor device having said hexagonal crystal structure on said surface of said compound semiconductor region by use of said dielectric stripe masks.

2. The method as claimed in claim 1, wherein said hexagonal crystal structure has a face tilted from (0001) face by an angle in the range of 0 degree to 10 degrees, and wherein said stripe-shaped opening of said dielectric stripe masks have a longitudinal direction having an included angle to a 11–20 direction in the range of –5 degrees to +5 degrees.

3. The method as claimed in claim 1, wherein said hexagonal crystal structure has a face tilted from a (0001)-face by an angle in the range of 0 degree to 10 degrees, and wherein said stripe-shaped opening of said dielectric stripe masks have a longitudinal direction having an included angle to a [1–100] direction in the range of –5 degrees to +5 degrees.

4. The method as claimed in claim 1, wherein said compound semiconductor of said current block layer is of an opposite conductivity type to that of said compound semiconductor region.

5. The method as claimed in claim 4, wherein said compound semiconductor of said current block layer and said compound semiconductor region are gallium nitride based semiconductors.

6. The method as claimed in claim 4, wherein said compound semiconductor of said current block layer and said compound semiconductor region are boron nitride based semiconductors.

7. The method as claimed in claim 1, wherein said compound semiconductor of said current block layer has a highly resistive compound semiconductor.

8. The method as claimed in claim 7, wherein said highly resistive compound semiconductor is an undoped semiconductor.

9. The method as claimed in claim 1, wherein said compound semiconductor region comprises a compound semiconductor base layer having a flat top surface, and wherein said current block layer is selectively grown on said flat top surface of said compound semiconductor base layer by use of said dielectric stripe masks provided on said flat top surface of said compound semiconductor base layer.

10. The method as claimed in claim 1, further comprising the step of forming an additional compound semiconductor layer of the same conductivity type as said compound semiconductor base layer so that said additional compound semiconductor layer extends on both side walls and a top surface of said current block layer and also extends over said compound semiconductor base layer under said stripe-shaped opening under said stripe shaped opening.

11. The method as claimed in claim 1, further comprising the step of forming laminations of a plurality of additional compound semiconductor layers of the same conductivity type as said compound semiconductor base layer so that said laminations of said plurality of additional compound semiconductor layers extend on both side walls and a top surface of said current block layer and also extend over said compound semiconductor base layer under said stripe-shaped opening.

12. The method as claimed in claim 1, wherein said compound semiconductor region includes at least a flat base portion and at least a ridged portion, and wherein said current block layer is selectively grown both on said flat base portion and on side walls of said ridged portion by use of said dielectric stripe masks provided on a top portion of said ridged portion.

13. The method as claimed in claim 12, wherein said current block layer comprises a single layer having a top surface which is substantially the same level as said top portion of said ridged portion.

14. The method as claimed in claim 12, wherein said current block layer comprises laminations of a plurality of differnt layers and said laminations have a top surface which is substantially the same level as said top portion of said ridged portion.

15. The method as claimed in claim 14, wherein laminations are formed by depositing a first layer having an opposite conductivity type to said compound semiconductor region, depositing a second layer being laminated on said first layer and having the same conductivity type as said compound semiconductor region over said first layer, and a third layer being laminated on said second layer and having said opposite conductivity type to said compound semiconductor semiconductor region over said second layer.

16. The method as claimed in claim 1, wherein said current block layer is selectivity grown by a matal organic chemical vapor deposition method.

17. A method of forming a current block layer structure in a gallium nitride based compound semiconductor laser device, comprising the steps of:

providing dielectric stripe masks defining at least a stripe-shaped opening on a flat surface of a compound semiconductor region having a hexagonal crystal structure;

selectively growing at least a ridge-shaped current block layer of a compound semiconductor having said hexagonal crystal structure on said surface of said compound semiconductor region by use of said dielectric stripe masks; and forming at least an additional compound semiconductor layer of the same conductivity type as said compound semiconductor base layer so that said additional compound semiconductor layer extends on both side walls and a top surface of said current block layer and also extends over said compound semiconductor base layer under said stripe-shaped opening for forming a compound semiconductor laser device.

18. The method as claimed in claim 17, wherein said hexagonal crystal structure has a face tilted from a (0001)-face by an angle in the range of 0 degree to 10 degrees, and wherein said stripe-shaped opening of said dielectric stripe masks have a longitudinal direction having an included angle to a [11–20] direction in the range of −5 degrees to +5 degrees.

19. The method as claimed in claim 17, wherein said hexagonal crystal structure has a face tilted from a (0001)-face by an angle in the range of 0 degree to 10 degrees, and wherein said stripe-shaped opening of said dielectric stripe masks have a longitudinal direction having an included angle to a [1–100] direction in the range of −5 degrees to +5 degrees.

20. The method as claimed in claim 17, wherein said compound seimconductor of said current block layer is of an opposite conductivity type to that of said compound semiconductor region.

21. The method as claimed in claim 17, wherein said compound semiconductor of said current block layer and said compound semiconductor region are gallium nitride based semiconductor.

22. The method as claimed in claim 17, wherein said compound semiconductor of said current block layer and said compound semiconductor region are boron nitride based semiconductor.

23. The method as claimed in claim 17, wherein said compound semiconductor of said current block layer has a highly resistive compound semiconductor.

24. The method as claimed in claim 23, wherein said highly resistive compound semiconductor is an undoped semiconductor.

25. The method as claimed in claim 17, wherein said current block layer is selectively grown by a metal organic chemical vapor deposition method.

26. A method of forming a current block layer structure in a gallium nitride based compound semiconductor laser device, comprising the steps of:

forming flat base portions and ridged portions of a compound semiconductor region;

providing dielectric stripe masks defining at least a stripe-shaped opening on said ridged portion of said compound semiconductor region having a hexagonal crystal structure;

selectively growing at least a current block layer of a compound semiconductor having said hexagonal crystal structure both on said flat base portion and on side walls of said ridged portion by use of said dielectric stripe masks for forming a compound semiconductor laser device.

27. The method as claimed in claim 26, wherein said hexagonal crystal structure has a face tilted from a (0001)-face by an angle in the range of 0 degree to 10 degrees, and wherein said stripe-shaped opening of said dielectric stripe masks have a longitudianl direction having an included angle to a [11–20] direction in the range of −5 degrees to +5 degrees.

28. The method as claimed in claim 26, wherein said hexagonal crystal structure has a face tilted from a (0001)-face by an angle in the range of 0 degree to 10 degrees, and wherein said stripe-shaped opening of said dielectric stripe masks have a longitudinal direction having an included angle to a [1–100] direction in the range of −5 degrees to +5 degrees.

29. The method as claimed in claim 26, wherein said compound semiconductor of said current block layer is of an opposite conductivity tpe to that of said compound semiconductor region.

30. The method as claimed in claim 26, wherein said compound semiconductor of said current block layer and said compound semiconductor region are gallium nitride based semiconductor.

31. The method as claimed in claim 26, wherein said compound semiconductor of said current block layer and said compound semiconductor region are boron nitride based semiconductor.

32. The method as claimed in claim 26, wherein said compound semiconductor of said current block layer has a highly resistive compound semiconductor.

33. The method as claimed in claim 26, wherein said highly resistive compound semiconductor is an undoped semiconductor.

34. The method as claimed in claim 26, wherein said current block layer comprises a single layer a top surface which is substantially the same level as said top portion of said ridged portion.

35. The method as claimed in claim 26, wherein said current block layer comprises laminations of a plurality of different layers and said laminations have a top surface which is substantially the same level as said top portion of said ridged portion.

36. The method as claimed in claim 35, wherein said laminations are formed by depositing a first layer having an opposite conductivity type to said compound semiconductor region, depositing a second layer being laminated on said first layer and having the same conductivity type as said compound semiconductor region over said first layer, and a third layer being laminated on said second layer and having said opposite conductivity type to said compound semiconductor region over said second layer.

37. The method as claimed in claim 26, wherein said current block layer is selectively grown by a metal organic chemical vapor deposition method.

38. A method of forming a current confinement structure in a gallium nitride based compound semiconductor layer device, comprising the steps of:

providing dielectric stripe masks defining at least a stripe-shaped opening on a flat surface of a compound semiconductor region having a hexagonal crystal structure; and selectively growing a compound semiconductor ridge-shaped layer of a hexagonal crystal structure in said strip-shaped opening over said compound semiconductor base layer as well as over parts of said dielectric stripe mask for forming a compound semiconductor layer device, wherein said hexagonal crystal structure has a face tilted from a (0001)-face by an angle in the range of 0 degree to 10 degrees, and wherein said stripe-shaped opening of said dielectric stripe masks have a longitudinal direction having an included angle to a [11–20] direction in the range of −5 degrees to +5 degrees.

39. A method of forming a current confinement structure in a gallium nitride base compound semiconductor layer device, comprising the steps of:

providing dielectric stripe masks defining at least a stripe-shaped opening on a flat surface of a compound semiconductor region having a hexagonal crystal structure; and selectively growing a compound semiconductor ridge-shaped layer of a hexagonal crystal structure in said stripe shaped opening over said compound simiconductor base layer as well as over parts of said dielectric stripe mask for forming a compound semiconductor layer device, wherein said hexagonal crystal structure has a face tilted from a (0001)-face by an angle in the range of 0 degree to 10 degrees, and wherein said stripe-shaped opening of said dielectric stripe masks have a longitudinal direction having an included angle to a [1–100] direction in the range of −5 degrees to +5 degrees.

* * * * *